(12) United States Patent
Karimata et al.

(10) Patent No.: US 8,884,225 B2
(45) Date of Patent: Nov. 11, 2014

(54) SAMPLE OBSERVING DEVICE AND SAMPLE OBSERVING METHOD

(71) Applicant: Ebara Corporation, Tokyo (JP)

(72) Inventors: Tsutomu Karimata, Tokyo (JP); Tatsuya Kohama, Tokyo (JP); Shoji Yoshikawa, Tokyo (JP); Masahiro Hatakeyama, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 13/665,623

(22) Filed: Oct. 31, 2012

(65) Prior Publication Data

US 2013/0161511 A1 Jun. 27, 2013

(30) Foreign Application Priority Data

Oct. 28, 2011 (JP) .................. 2011-236586

(51) Int. Cl.
*H01J 37/28* (2006.01)
*H01J 37/26* (2006.01)
*H01J 37/073* (2006.01)
*H01J 37/12* (2006.01)

(52) U.S. Cl.
CPC ....... *H01J 37/261* (2013.01); *H01J 2237/2443* (2013.01); *H01J 2237/1205* (2013.01); *H01J 2237/186* (2013.01); *H01J 2237/06333* (2013.01); *H01J 2237/1518* (2013.01); *H01J 37/073* (2013.01); *H01J 2237/036* (2013.01); *H01J 37/12* (2013.01); *H01J 2237/062* (2013.01); *H01J 37/265* (2013.01); *H01J 2237/2817* (2013.01); *H01J 37/28* (2013.01)
USPC ........... 250/311; 250/306; 250/310; 250/397; 250/396 R; 250/399

(58) Field of Classification Search
USPC ............ 250/306, 307, 310, 311, 396 R, 398, 250/399, 397
See application file for complete search history.

(56) References Cited

U.S. PATENT DOCUMENTS

| 5,557,105 | A * | 9/1996 | Honjo et al. ............... 250/310 |
|---|---|---|---|
| 6,566,658 | B1 * | 5/2003 | Okubo .................... 250/398 |
| 7,067,809 | B2 * | 6/2006 | Lo et al. .................. 250/310 |
| 2003/0168606 | A1 * | 9/2003 | Adamec et al. ........... 250/396 R |
| 2004/0119021 | A1 * | 6/2004 | Parker et al. ............. 250/396 R |
| 2005/0173649 | A1 | 8/2005 | Okumura et al. |
| 2007/0194229 | A1 | 8/2007 | Okuda et al. |

(Continued)

FOREIGN PATENT DOCUMENTS

| JP | 2007-157575 A | 6/2007 |
|---|---|---|
| JP | 2008-100948 A | 5/2008 |
| JP | 2008-141141 A | 6/2008 |
| JP | 2009-76474 A | 4/2009 |
| WO | 2009/125703 A1 | 10/2009 |

*Primary Examiner* — Michael Logie
(74) *Attorney, Agent, or Firm* — Westerman, Hattori, Daniels & Adrian, LLP

(57) ABSTRACT

An electron beam inspection device observes a sample by irradiating the sample set on a stage with electron beams and detecting the electron beams from the sample. The electron beam inspection device has one electron column which irradiates the sample with the electron beams, and detects the electron beams from the sample. In this one electron column, a plurality of electron beam irradiation detecting systems are formed which each form electron beam paths in which the electron beams with which the sample is irradiated and the electron beams from the sample pass. The electron beam inspection device inspects the sample by simultaneously using a plurality of electron beam irradiation detecting systems and simultaneously irradiating the sample with the plurality of electron beams.

8 Claims, 33 Drawing Sheets

(56) References Cited

U.S. PATENT DOCUMENTS

| | | | |
|---|---|---|---|
| 2007/0221846 A1* | 9/2007 | Todokoro et al. | 250/310 |
| 2008/0308729 A1* | 12/2008 | Kimba et al. | 250/307 |
| 2010/0320382 A1* | 12/2010 | Almogy et al. | 250/307 |
| 2012/0164583 A1* | 6/2012 | Yamaguchi et al. | 430/296 |
| 2012/0280125 A1* | 11/2012 | Kuan et al. | 250/310 |

* cited by examiner

Fig.15
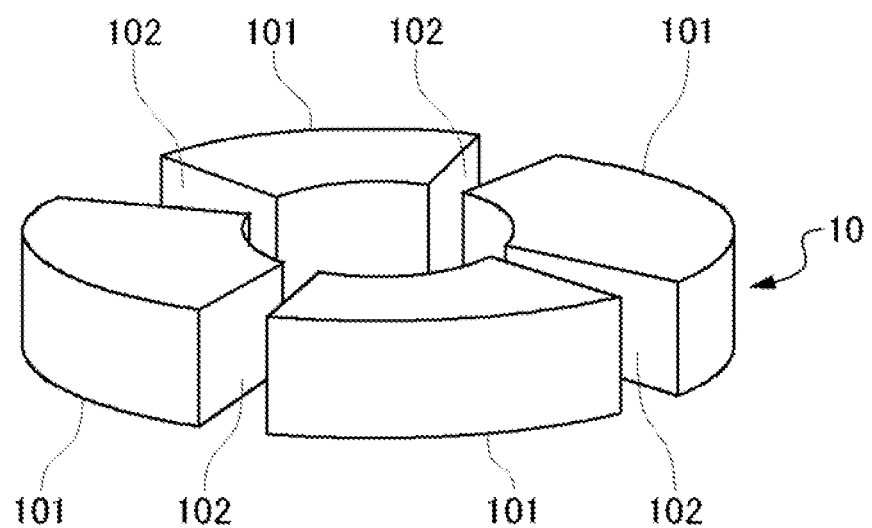
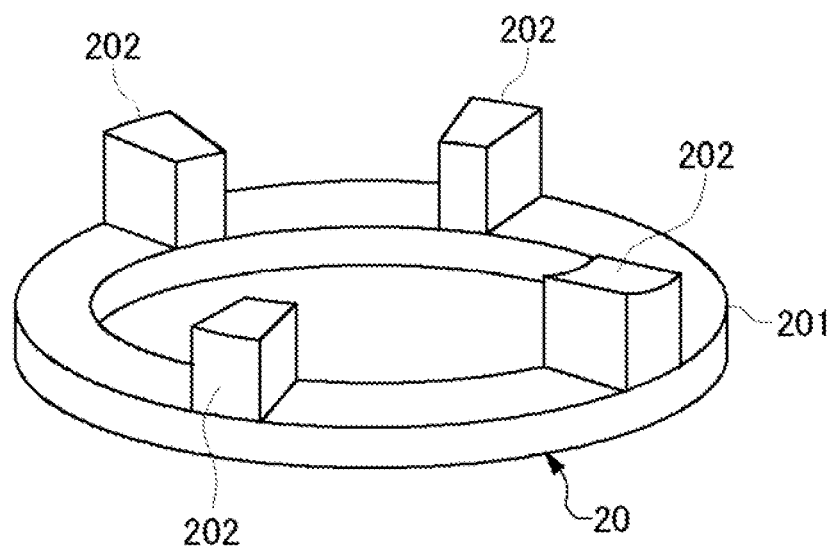

SAMPLE OBSERVING DEVICE AND SAMPLE OBSERVING METHOD

CROSS-REFERENCE TO RELATED APPLICATIONS

This application claims priority to Japanese Patent No. 2011-236586 filed on Oct. 28, 2011, the entire contents of which are incorporated by reference herein.

BACKGROUND OF THE INVENTION

1. Field of the Invention

The present invention relates to a sample observing device and a sample observing method which observe a sample by irradiating the sample with electron beams and detecting the electron beams from the sample.

2. Description of Related Art

Conventionally, in, for example, a field of semiconductor manufacturing, sample observing devices are used to, for example, inspect defects of sample substrates such as wafers and masks. In recent years, accompanying improvement in the degree of integration of semiconductor large-scale integrated circuits (LSI), patterns formed on wafers and masks are increasingly miniaturized, and, accompanying this miniaturization, sizes of defect detection targets are also becoming smaller. Hence, when a sample substrate is observed to, for example, inspect a defect, a sample observing device of high resolution is required.

For a sample observing device of high resolution, a scanning electron microscope (SEM) can be used. The scanning electron microscope scans a sample surface by irradiating the sample surface with narrowed electron beams, detects the intensity of secondary electrons or reflected electrons (simply "secondary electrons and the like" below) produced from the sample upon irradiation of the electron beam, and maps the intensity at a position matching a scanning position to generate an observation image.

SUMMARY OF THE INVENTION

Although, when a unit pixel is smaller, image quality is higher in this observation image, the unit pixel generally has a size which is larger than half the diameter of the electron beam. When, for example, the electron beam having the diameter of 100 nm is used, the size of the unit pixel is 50 nm or more. When, for example, the unit pixel size is 50 nm and one pixel is scanned at 3 ns, $4 \times 10^{10}$ unit pixels having 50 nm of four sides are included in an area of 1 cm$^2$, and 120 seconds are required to scan the area of 1 cm$^2$. Consequently, for example, 90 hours or more are required to scan the entire surface of the wafer having 300 mm of the diameter. Accompanying an increase in sizes of wafers and masks, a time required for observation becomes longer, resulting in a yield rate of a production speed.

It may be possible to increase a scanning speed in order to reduce an observation required time. Meanwhile, image quality of an observation image depends on the amount of the secondary electrons and the like, and therefore it is necessary to increase the amount of secondary electrons and the like to be detected per unit time in order to increase the scanning speed without decreasing image quality and therefore it is necessary to increase the amount of electrons to be irradiated with (increase a current).

However, the electron beam has property that, when there are a lot of electrons in the single space, electrons repel against each other due to a Coulomb effect resulting from negative electric charges of these electrons, and the electron beam widens (space-charge effect). Further, the electron beam widens more when an accelerating voltage is lower. Hence, when the resolution (that is, the diameter of the electron beam) is determined, a maximum value of the current is principally limited, resulting in limiting a maximum scanning speed, and therefore it is not possible to increase the scanning speed more.

The present invention is made in light of the above problem, and an object of the present invention is to provide a sample observing device and method which can have high resolution and reduce the time required to scan electron beams upon scanning the electron beams and observing the sample.

A sample observing device according to an embodiment is a sample observing device which observes a sample by irradiating the sample set on a stage with an electron beam and detecting the electron beam from the sample, and has: an electron column which irradiates the sample with the electron beam and detects the electron beam from the sample, and the electron column has a plurality of electron beam irradiation detecting systems which each form an electron beam path in which the electron beam with which the sample is irradiated and the electron beam from the sample pass, and observes the sample by simultaneously using the plurality of electron beam irradiation detecting systems and simultaneously irradiating the sample with a plurality of electron beams.

A method of observing a sample according to an embodiment is a sample observing method using the above sample observing device, includes: observing the sample by means of the plurality of electron beams by simultaneously using the plurality of electron beam irradiation detecting systems; and generating an observation image by synthesizing observation results.

According to the present invention, the sample observing device has a plurality of electron beam irradiation detecting systems in one electron column, and observes a sample by simultaneously using a plurality of these electron beam irradiation detecting systems and simultaneously irradiating the sample with a plurality of electron beams, so that it is possible to reduce the time required to scan electron beams for observing the sample without decreasing the resolution.

As described above, there are other aspects of the present invention. Hence, disclosure of the present invention is intended to provide part of the present invention, and is not intended to limit the scope of the present invention described and claimed herein.

BRIEF DESCRIPTION OF THE DRAWINGS

FIG. 15 is an exploded perspective view illustrating the first deflector and a spacer below the first deflector according to the embodiment of the present invention;

FIG. 26 illustrates a positional relationship of a reference beam of each electron beam irradiation detecting system according to the embodiment of the present invention;

DESCRIPTION OF EMBODIMENTS

Figure 1:
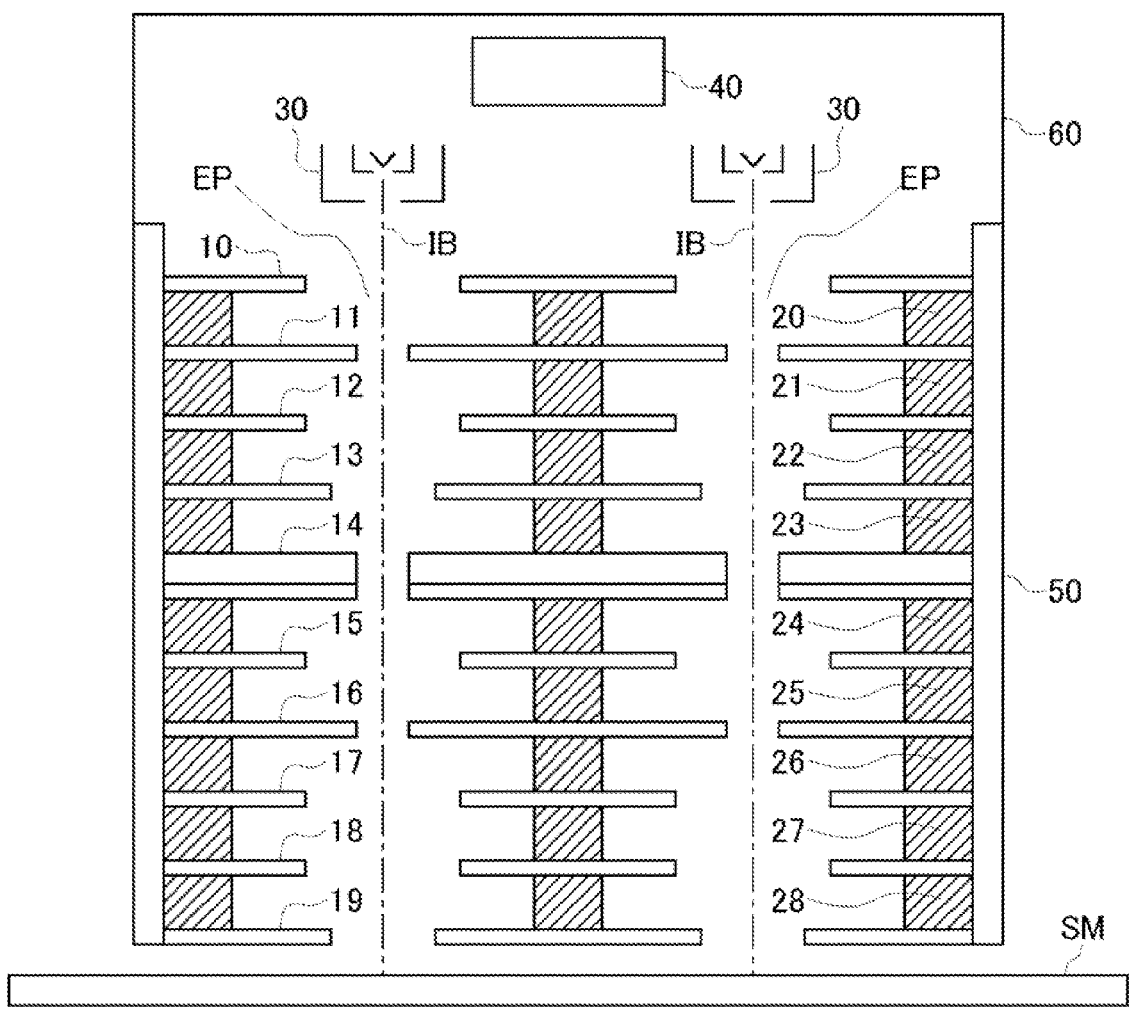
FIG. 1 illustrates a configuration of an electron column according to an embodiment of the present invention.

Hereinafter, the present invention will be described in detail. Embodiments described below are only examples of the present invention, and the present invention can be modified to various modes. Hence, specific configurations and functions disclosed below by no means limit the scope of the claims.

A sample observing device according to an embodiment of the present invention is a sample observing device which observes a sample by irradiating the sample set on a stage with an electron beam and detecting the electron beam from the sample, and has: an electron column which irradiates the sample with the electron beam and detects the electron beam from the sample, and the electron column has a plurality of electron beam irradiation detecting systems which each form an electron beam path in which the electron beam with which the sample is irradiated and the electron beam from the sample pass, and observes the sample by simultaneously using the plurality of electron beam irradiation detecting systems and simultaneously irradiating the sample with a plurality of electron beams.

According to this configuration, the sample observing device according to the embodiment has a plurality of electron beam irradiation detecting systems in one electron column, and observes a sample by simultaneously using a plurality of these electron beam irradiation detecting systems and simultaneously irradiating the sample with a plurality of electron beams, so that it is possible to reduce the time required to scan electron beams for observing the sample. Further, in order to simultaneously irradiate a sample with a plurality of electron beams, a plurality of electron beam irradiation detecting systems are formed in one electron column instead of using a plurality of conventional electron columns having one electron beam irradiation detecting system, so that it is possible to reduce an interval between adjacent electron beams and, consequently, increase the number of electron beams with which the sample can be simultaneously irradiated. Meanwhile, the electron beam irradiation detecting system refers to a system which forms an electron beam path for condensing and deflecting the electron beam emitted from an electron gun and irradiating a sample with the electron beam, and detects the electron beam from the sample having passed through the electron beam path. In the above sample observing device, a plurality of these systems is formed in one electron column.

In the sample observing device according to the embodiment, the electron column has: a cylindrical body; and an electron gun housing which covers the cylindrical body, and has per electron beam irradiation detecting system: a plurality of parts which include a lens, a deflector and a detector stacked in the cylindrical body; and a plurality of electron guns which are accommodated in the electron gun housing, and which irradiate each of the electron beam paths with the electron beams. According to this configuration, a plurality of sets of a plurality of parts and electron guns corresponding to a plurality of electron beam irradiation detecting systems are provided in one electron column, so that it is possible to make the device smaller.

In the sample observing device according to the embodiment, the lens may be an electrostatic lens, and the deflector may be an electrostatic deflector. Generally, instead of the electrostatic lens and deflector, a magnetic field lens and deflector may be adopted for the lens and the deflector of the electron beam irradiation detecting systems. However, in the sample observing device according to the embodiment, a plurality of electron beam irradiation detecting systems are formed in one electron column as described above, and a distance between adjacent electron beam irradiation detecting systems is close. If the magnetic field lens and deflector are used in this case, an influence on an adjacent electron beam irradiation detecting system due to magnetic field leakage becomes significant. By contrast with this, the sample observing device according to the embodiment uses the electrostatic lens and deflector, so that it is also possible to prevent the influence due to magnetic field leakage in the electron column in which a plurality of adjacent electron beam irradiation detecting systems are formed at close distances. Further, the magnetic field lens and deflector require coils and yokes wound around the coils, and therefore make the device larger. The sample observing device according to the embodiment adopts the electrostatic lens and deflector, so that it is possible to prevent an increase in the size of the device which occurs when the magnetic field type is adopted. Thus, by adopting the electrostatic lens and deflector, it is possible to form more electron beam irradiation detecting systems in one electron column, and increase the number of electron beams with which a sample can be simultaneously irradiated.

In the sample observing device according to the embodiment, spacers made of conductive ceramic having resistances $10^9$ to $10^{12} \Omega$ cm may be disposed between a plurality of parts stacked in the cylindrical body. According to this configuration, it is possible to suppress thermal expansion of the electron column, and allow precise assembly.

In the sample observing device according to the embodiment, a plurality of spacers may be made of the same material. According to this configuration, it is possible to make coefficients of thermal expansion of all spacers the same, and minimize an influence due to thermal expansion in the electron column as a whole.

In the sample observing device according to the embodiment, the cylindrical body may be made of the same material as the spacers. According to this configuration, it is possible to more precisely assemble the electron column.

In the sample observing device according to the embodiment, the spacers may be exposed from the electron beam paths. According to this configuration, it is possible to make the electron column smaller than a configuration where the spacers are hidden from the electron beam paths.

In the sample observing device according to the embodiment, the electron column may further have a wiring film which is provided along an outer peripheral surface of the cylindrical body and in which an electrically-conductive line which connects an external power supply to the parts is laid, a wiring hole may be provided at a position meeting terminals of the parts in the cylindrical body and the wiring film, and the terminals of the parts and the electrically-conductive line of the wiring film may be electrically connected by a contact pin inserted in the wiring hole. According to this configuration, it is possible to electrically connect each part in the cylindrical body and the external power supply.

In the sample observing device according to the embodiment, by screwing the wiring hole of the cylindrical body and the contact pin, the contact pin may be held. According to this configuration, the contact pin can be held to the cylindrical body without requiring a special holding member.

In the sample observing device according to the embodiment, the wiring film may be formed with a metal layer which serves as the electrically-conductive line and an insulation layer which sandwiches both surfaces of the metal layer, a flange of the electrically-conductive line may be formed in the wiring hole of the wiring film, and, when a head portion of the contact pin abuts on the flange, the contact pin and the electrically-conductive line may be electrically connected. According to this configuration, it is possible to increase a contact area between the contact pin and the electrically-conductive line in the wiring film, and reduce the likelihood of connection failure.

In the sample observing device according to the embodiment, a grounding coating may be interposed between the wiring film and the cylindrical body. According to this configuration, even when there is a gap between the wiring film and the cylindrical body, it is possible to prevent electric discharging in this gap.

In the sample observing device according to the embodiment, the deflector may have a plurality of electrodes including two opposing electrodes, and the electrically-conductive line from one of the two opposing electrodes to a terminal thereof is laid on the surface of the deflector and the electrically-conductive line from the other one to a terminal thereof is laid on the back surface of the deflector. By arranging the wirings in this way, it is possible to form, in a plane, multiple electrically-conductive lines which are required when a plurality of electron beam irradiation detecting systems are formed in one electron column, without causing interference between the electrically-conductive lines.

In the sample observing device according to the embodiment, the electron gun may have: a laser light source which emits laser light; a gas filled tube which forms plasma small space by the laser light emitted from the laser light source; a fiber which allows propagation of an invisible light beam emitted from the gas filled tube; a photoelectric material which is provided at a tip of the fiber, and which receives the invisible light beam having been emitted from the gas filled tube and propagated in the fiber and emits an electron; and an anode which leads an electron emitted from the photoelectric material. According to this configuration, the electron gun housing only needs to accommodate at least a tip portion of the fiber, the photoelectric material provided at the tip portion and the anode, and other components can be arranged in atmosphere, so that it is possible to reduce an interval between electron beams irradiated from electron guns, form more electron beam irradiation detecting systems in one electron column and increase the number of electron beams with which a sample can be simultaneously irradiated. Further, even when an output is increased, it is possible to emit an electron only from the tip of the fiber, and prevent or reduce blurring in an observation image caused when an irradiation beam passes an undesirable trajectory and improve resolution of the observation image.

In the sample observing device according to the embodiment, the electron gun may have: a laser light source which emits laser light; a gas filled tube which forms plasma small space by the laser light emitted from the laser light source; an aperture which allows part of invisible light beams emitted from the gas filled tube to pass; a base material in which the aperture is provided in an input plane and which allows propagation of the invisible light beam having passed through the aperture; a photoelectric material which is provided in an output plane of the base material, and which emits an electron in response to the invisible light beam having propagated through the base material; and an anode which leads the electron emitted from the photoelectric material. According to this configuration, the electron gun housing only needs to accommodate at least an electron emitting element including the aperture, the base material and the photoelectric material and the anode, and other components can be arranged in atmosphere, so that it is possible to reduce an interval between electron beams irradiated from electron guns, form more electron beam irradiation detecting systems in one electron column and increase the number of electron beams with which a sample can be simultaneously irradiated. Further, even when an output is increased, it is possible to reliably emit an electron only from the photoelectric material, and prevent or reduce blurring in an observation image caused when an irradiation beam passes an undesirable trajectory and improve resolution of the observation image. Furthermore, according to this configuration, it is possible to emit more electron beams of a narrow energy width. Still further, a structure is simple, so that it is possible to reduce cost. Moreover, according to this configuration, a Wehnelt is not required, so that it is possible to prevent beams from widening and improve the transmittance.

In the sample observing device according to the embodiment, a detector may have: an electron amplifier which bends an electron beam returning from a sample through an electron beam path and captures electrons, and amplifies the captured electrons; and an anode which absorbs the electron amplified by the electron amplifier and emitted from the electron amplifier, and may measure the amount of electrons from the sample based on the amount of electrons absorbed by the anode. According to this configuration, electron beam paths for irradiation and electron beam paths for detection do not need to be separately prepared, and one electron beam path can perform irradiation and detection, so that it is possible to make one electron beam irradiation detecting system smaller, and increase the number of electron beam irradiation detecting systems to be formed in one electron column.

In the sample observing device according to the embodiment, the detector may be disposed at a distance which is separated two hundred fold scanning width of the electron beam irradiation detecting system or more from the surface of the sample. According to this configuration, it is possible to efficiently capture electron beams from the sample.

In the sample observing device according to the embodiment, a detector may have: a scintillator which bends an electron beam returning from a sample through an electron beam path and captures electrons, and converts the captured electrons into light of an intensity matching the amount of electrons; a light guide which transmits light incident from the scintillator; and a photomultiplier tube which outputs a signal matching the intensity of incident light transmitted by the light guide, and may measure the amount of electrons from the sample based on the signal. Also, according to this configuration, electron beam paths for irradiation and electron beam paths for detection do not need to be separately prepared, and one electron beam path can perform irradiation and detection, so that it is possible to make one electron beam irradiation detecting system smaller, and increase the number of electron beam irradiation detecting systems to be formed in one electron column.

In the sample observing device according to the embodiment, the detector may have a plurality of scintillators, and perform correction according to a distribution of a capturing rate of electrons in the plurality of scintillators. According to this configuration, it is possible to increase the amount of electrons which can be captured, evenly capture electrons from the sample based on the distribution of the capturing rates depending on a site and perform correction such that capturing positions do not concentrate.

In the sample observing device according to the embodiment, the scintillator may have a built-in tilted mirror which reflects incident electrons toward the photoelectron multiplier tube. According to this configuration, it is possible to efficiently transmit light to the photoelectron multiplier tube.

In the sample observing device according to the embodiment, the electron gun housing may have a plurality of housing holes meeting the plurality of electron guns, the electron beam observing device may further have a bulb, the bulb may have: a plurality of O rings which each surround the plurality of housing holes; and a plurality of bulb holes which meet the plurality of housing holes, while an area surrounded by the plurality of O rings and the plurality of bulb holes are misaligned and provided in the bulb, and by moving the bulb with respect to the electron gun housing, the housing holes may be blocked by the O rings or electron beams from the electron guns may be allowed to pass in the bulb holes. According to this configuration, an electron beam from an electron gun is allowed to pass, and the electron gun housing is sealed by a simple operation of slightly moving the bulb position.

In the sample observing device according to the embodiment, the cylindrical body may have at a lower end portion a plurality of cylindrical body holes meeting the plurality of electron beam irradiation detecting systems, the electron beam observing device may further have a bulb, the bulb may have: a plurality of O rings which each surround the plurality of cylindrical body holes; and a plurality of cylindrical body holes which meet the plurality of cylindrical body holes, while an area surrounded by the plurality of O rings and the plurality of bulb holes are misaligned and provided in the bulb, and by moving the bulb with respect to the cylindrical body, the cylindrical body holes may be blocked by the O rings or electron beams from the electron guns may be allowed to pass in the bulb holes. According to this configuration, an electron beam from an electron gun is allowed to pass, and space formed by the electron gun housing and the cylindrical body is sealed by a simple operation of slightly moving the bulb position.

In the sample observing device according to the embodiment, the deflector may have an upper electrode to which a first alternate current voltage is applied to perform macro scanning, and a lower electrode to which a second alternate voltage having a smaller amplitude and a higher frequency than the first alternate current voltage is applied to perform micro scanning. According to this configuration, electron beams to be irradiated with can be deflected at a high frequency according to micro scanning, so that it is possible to increase a scanning speed and reduce an inspection time for a sample.

In the sample observing device according to the embodiment, each upper electrode of a plurality of electron beam irradiation detecting systems may share a power supply. According to this configuration, it is possible to reduce cost, and make an electron column smaller.

The method of observing a sample according to the embodiment of the present invention is a method performed using the above sample observing device. This method of observing a sample includes: observing the sample by means of a plurality of electron beams by simultaneously using the plurality of electron beam irradiation detecting systems; and generating an observation image by synthesizing observation results. According to this method of observing the sample, the sample is observed by simultaneously using a plurality of electron beam irradiation detecting systems and simultaneously irradiating the sample with a plurality of electron beams, so that it is possible to reduce the time required to scan the electron beams for observing the sample.

The method of observing the sample according to the embodiment may further include acquiring in advance and storing irradiation position characteristics of each electron beam of a plurality of electron beam irradiation detecting systems, and calibrating each result of the electron beam irradiation detecting systems according to irradiation position characteristics.

The method of observing the sample according to the embodiment observes a sample using a sample observing device which includes a plurality of electron beams irradiation detecting systems in one electron column. Hence, if the position of the electron beam irradiated from each electron beam irradiation detecting system is not accurately detected, an error would be produced when an observation result in each electron beam irradiation detecting system is synthesized, and an observation image will become discontinuous. With the method of observing a sample according to the embodiment, the observation result in each electron beam irradiation detecting system is calibrated according to irradiation position characteristics of each electron beam irradiation detecting system, so that it is possible to obtain a continuous observation image by synthesis.

The method of observing a sample according to the embodiment may further include detecting a test mark using a reference electron beam in each of a plurality of electron beam irradiation detecting systems, and acquiring each irradiation position characteristics of a plurality of electron beam irradiation detecting systems based on a relative positional relationship with respect to a stage upon detection of the test mark. According to this configuration, it is possible to easily acquire irradiation position characteristics of each electron beam irradiation detecting system by utilizing the test mark.

The method of observing a sample according to the embodiment may further include acquiring irradiation position characteristics of each of a plurality of electron beam irradiation detecting systems for a plurality of magnifying powers of the electron beam irradiation detecting systems. According to this configuration, it is possible to obtain the irradiation position characteristics according to each magnifying power of the electron beam irradiation detecting system, and perform more accurate calibration.

The method of observing a sample according to the embodiment may further include acquiring in advance and storing focus adjustment values for a plurality of points on the sample set on the stage, and adjusting the foci of a plurality of electron beam irradiation detecting systems according to the focus adjustment values per observation position of the sample to observe the sample using a plurality of electron beam irradiation detecting systems. According to this configuration, it is possible to reduce deterioration of image quality (out of focus) of an observation image due to a tilt of a stage, a tilt of a sample and/or a tilt of the electron column.

A plurality of dies of the identical pattern may be arranged in a matrix as the sample, and the method of observing a sample according to the embodiment may further include observing defects of dies by comparing a plurality of dies. According to this configuration, it is possible to inspect defects of dies by performing die-die comparison of the sample using the sample observing device which includes a plurality of electron beam irradiation detecting systems in one electron column.

The method of observing a sample according to the embodiment may further include observing a defect of a die by observing dies of interest in each of a plurality of electron irradiation detecting systems and comparing observation results of the electron beam irradiation detecting systems.

According to this configuration, it is possible to perform die-die comparison by comparing inspection results from each electron beam irradiation detecting system.

The method of observing a sample according to the embodiment may further include stopping observation when a die of interest is not at a position at which the die can be observed in each of a plurality of electron beams irradiation detecting systems. According to this configuration, even when a pitch of the dies and an alignment pitch of the electron beam irradiation detecting systems do not match, it is possible to perform die-die comparison by comparing inspection results from each electron beam irradiation detecting system.

The method of observing a sample according to the embodiment may further include repeating deflecting an electron beam to be irradiated with by the electron beam irradiation detecting system and moving the stage in each of a plurality of electron beam irradiation detecting systems, finishing observing a corresponding portion of a plurality of dies and then comparing the observation results of the portion. According to this configuration, it is possible to perform die-die comparison per electron beam irradiation detecting system for a die having a substantially larger size than a deflectable range of the electron beam, and the dies are compared at a time when data at portions which can be compared and, consequently, it is possible to suppress a required memory capacity.

Hereinafter, an embodiment for implementing the present invention will be described with reference to the drawings. An electron beam inspection device for inspecting defects of wafers and masks will be described as a sample observing device which observes samples using electron beams.

1. Entire Configuration

Figure 2:
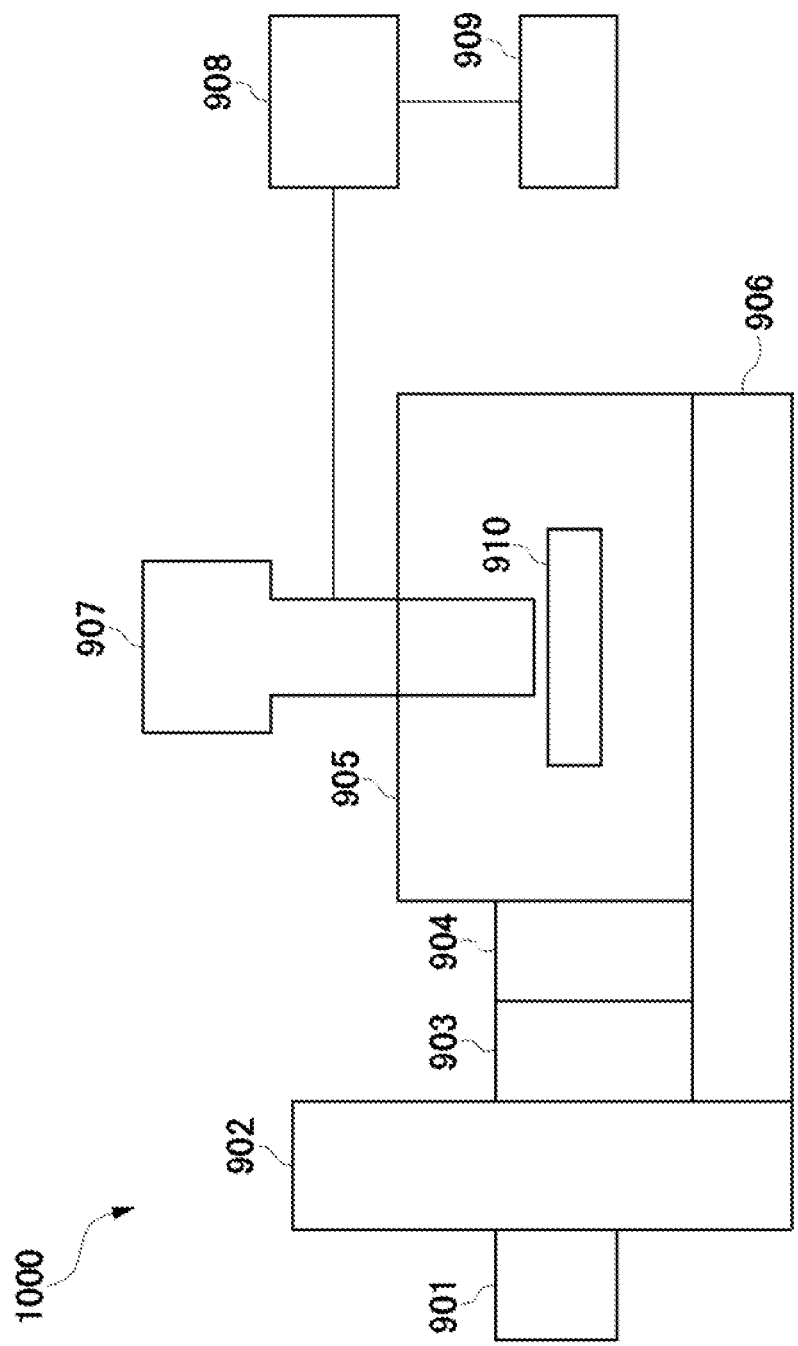
FIG. 2 illustrates an entire configuration of an electron beam inspection device according to the embodiment of the present invention.

FIG. 2 illustrates an entire configuration of an electron beam inspection device 1000. As illustrated in FIG. 2, the electron beam inspection device 1000 has a sample carrier (load port) 901, a mini-environment 902, a load lock 903, a transfer chamber 904, a main chamber 905, a vibration removal board 906, an electron column 907, an image processing unit 908 and a control unit 909. The electron column 907 is attached in an upper portion of the main chamber 905.

In the sample carrier 901, inspection target samples are accommodated. In the mini-environment 902, for example, a convey robot, a sample alignment device and a clean air supply mechanism in atmosphere which are not illustrated are provided. The samples in the sample carrier 901 are conveyed into the mini-environment 902, and are aligned by the sample alignment device. The samples are conveyed to the load lock 903 by the convey robot in atmosphere.

The load lock 903 is vacuumed from atmosphere to the vacuum state by a vacuum pump. When the pressure is a certain value (for example, 1 Pa) or less, the convey robot (not illustrated) in vacuum arranged in the transfer chamber 904 conveys the sample to the main chamber 905. Thus, the robot is arranged in the transfer chamber 904 which is in the vacuum state at all times, so that it is possible to minimize occurrence of, for example, particles due to fluctuation of the pressure.

In the main chamber 905, a stage 910 which moves in an x direction, a y direction and a θ (rotation) direction is provided, and an electrostatic chuck is set on the stage 910. The sample itself is set on the electrostatic chuck. Alternatively, the sample is held by the electrostatic chuck in a state where the sample is set on a palette or a jig. The main chamber 905 is controlled by a vacuum control system which is not illustrated to maintain a vacuum state. Further, the main chamber 905, the transfer chamber 904 and the load lock 903 are set on the vibration removal board 906 to prevent transmission of vibration from a floor.

Furthermore, one electron column 907 is disposed in the main chamber 905. A detection signal from this electron column 907 is sent to the image processing unit 908 and processed. The control unit 909 controls, for example, the image processing unit 908. Under this control, the image processing unit 908 can perform both of on-time signal processing and off-time signal processing. The on-time signal processing is performed during an inspection. When the off-time signal processing is performed, only an image is acquired, and signal processing is performed later.

Data processed by the image processing unit 908 is stored in a recording medium such as a hard disk or a memory. Further, if necessary, data can be displayed on a monitor of a console. Data to be displayed is, for example, an observation image, an inspection area, a foreign material count map, a foreign material size distribution/map, a foreign material classification and a patch image.

2. Multiple SEM Structure

Next, the electron column 907 will be described. The electron column 907 according to the present embodiment is a multiple SEM which includes in one cylindrical body a plurality of electron guns and electron beam paths in which electron beams from each electron gun pass, and in which a plurality of electron beam irradiation detecting systems are formed. FIG. 1 illustrates a configuration of the electron column 907. A housing of the electron column 907 is formed by the cylindrical body 50 and the electron gun housing 60. In the cylindrical body 50, various parts 10 to 19 described below are accommodated. The cylindrical body 50 has a cylindrical shape, and the electron gun housing 60 is a cylindrical part which covers an upper opening of the cylindrical body and has a sealed upper portion. Alternatively, the cylindrical body 50 may have a hollow square prism.

In the cylindrical body 50, various parts such as the first deflector (aligner) 10, the condenser lens 11, the second deflector (aligner) 12, the aperture 13, the detector 14, the third deflector (aligner) 15, the objective lens 16, the fourth deflector (aligner) 17, the fifth deflector (aligner) 18 and the electrode 19 are stacked in order from the top with spacers 20 to 28 interposed therebetween. Each of the above parts has holes at portions meeting upper and lower directions, and these holes form an electron beam path EP.

Figure 3:
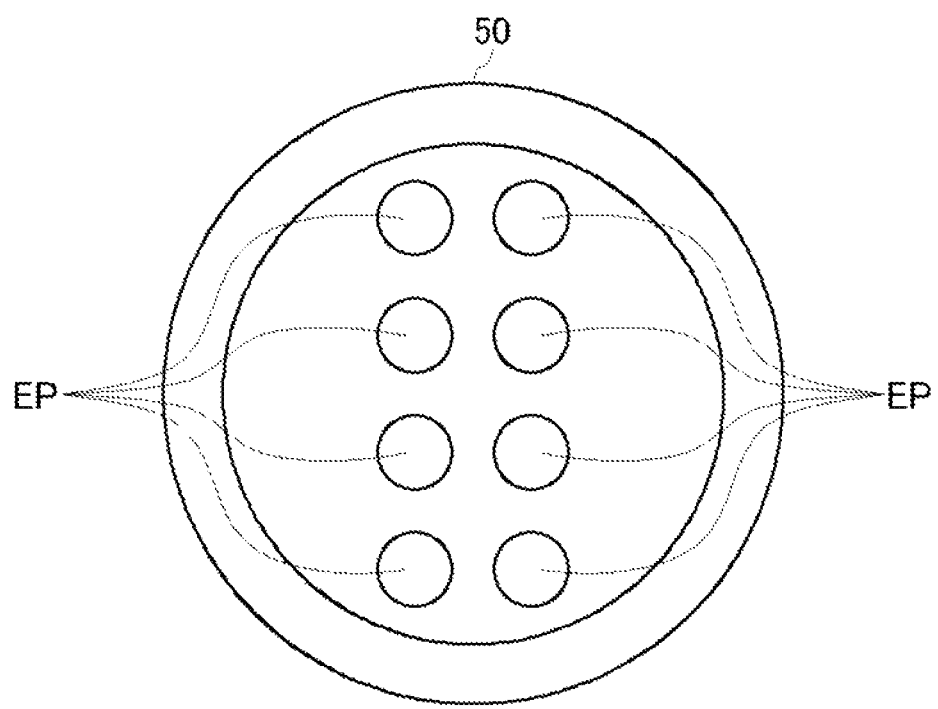
FIG. 3 is a plan view of a cylindrical body according to the embodiment of the present invention.
Figure 4:
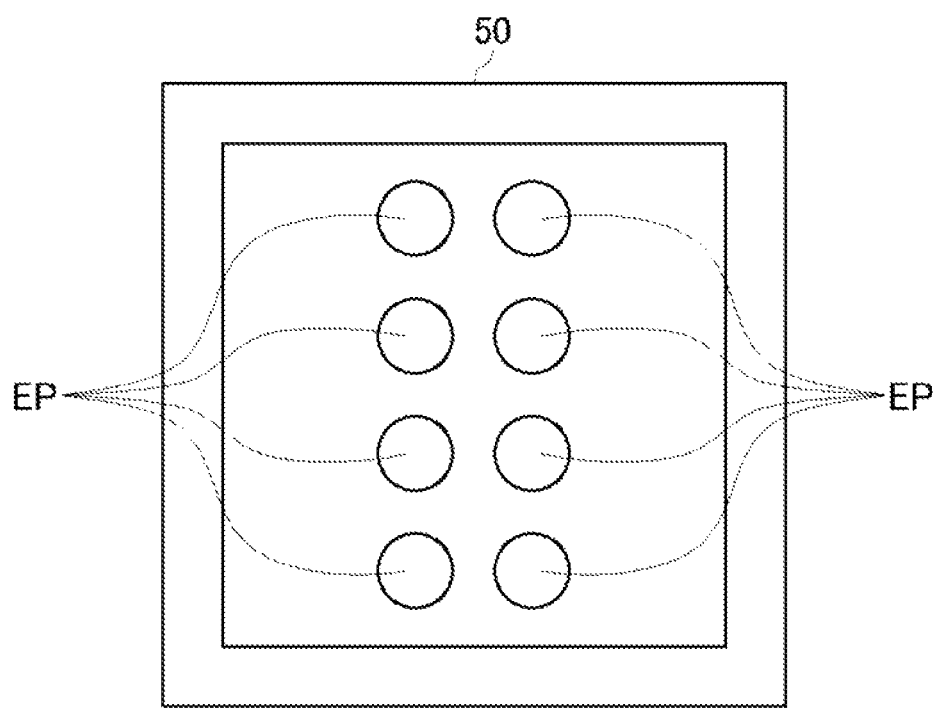
FIG. 4 is a plan view of another example of the cylindrical body according to the embodiment of the present invention.

FIG. 3 is a plan view of the cylindrical body 50 according to the present embodiment. FIG. 3 illustrates an example where the cylindrical body 50 has a cylindrical shape. In the cylindrical body 50, the eight electron beam paths EP in total arranged in two rows are formed. FIG. 4 is a plan view of another example of the cylindrical body 50 according to the present embodiment. FIG. 4 illustrates an example where the cylindrical body 50 has a square prism shape. Also, in this case, in the cylindrical body 50, the eight electron beam paths EP in total arranged in two rows are formed.

Back to FIG. 1, in the electron gun housing 60, the electron guns 30 and 30 and the vacuum pump 40 are accommodated. The electron guns 30 and 30 may be TFE (Thermal Field Emission) electron guns or FE (Field Emission) electron guns. Further, the vacuum pump 40 may be an ion pump or a getter pump.

A sample is advantageously scanned by simultaneously irradiating the sample with a plurality of electron beams by reducing an interval between the electron beam paths and increasing the number of electron beams (the number of electron beam irradiation detecting systems) with which the sample can be simultaneously irradiated. When the electron column becomes larger and the interval between electron beams becomes wider, the number of electron beams which can be simultaneously scanned decreases, and an advantage of a multiple SEM decreases. When, for example, a minimum interval between electron beam irradiation detecting systems is 100 mm, a sample having a width of 200 mm cannot be simultaneously irradiated with three or more electron beams in a width direction.

Meanwhile, a configuration where a plurality of electron columns having a cylindrical body provided with one electron beam irradiation detecting system are arranged may be employed as a configuration of simultaneously irradiating one sample with a plurality of electron beams. By contrast with this, according to the present embodiment, a plurality of electron beam irradiation detecting systems are formed in one cylindrical body, so that, compared to a case that a plurality of electron columns having a cylindrical body provided with one electron beam irradiation detecting system are aligned, it is possible to reduce a distance between electron beams and increase the number of electron beams with which the sample can be simultaneously irradiated (scanned).

3. Electron Gun

Although the conventional TFE electron guns or FE electron guns can be used for the electron guns 30 as described above, electron guns of another mode described below may be used.

3-1. TFE Electron Gun

Figure 5:
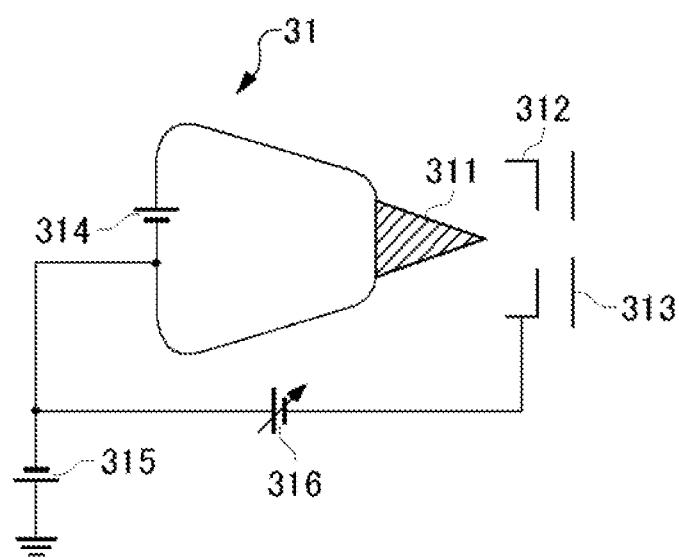
FIG. 5 illustrates a configuration of a TFE electron gun according to the embodiment of the present invention.

First, the TFE electron gun will be described. FIG. 5 is a view illustrating a configuration of the TFE electron gun. A TFE electron gun 31 has a cathode chip 311 having a sharp tip, a Wehnelt 312 and an anode 313. The size of the TFE electron gun 31 in the width direction is about 20 mm, and, when the two TFE electron guns 31 are placed as close as possible, pitches of electron beams to be irradiated with are about 20 mm. In addition, in the above configuration, a heater power supply 314 and a Wehnelt power supply 316 are accommodated in the electron gun housing 60 in addition to the cathode chip 311, the Wehnelt 312 and the anode 313.

The cathode chip 311 is applied a heater voltage from the heater power supply 314, and is applied a cathode voltage of about −50 to −10 kV from the cathode power supply 315. Further, the Wehnelt 312 is applied a variable voltage from the Wehnelt power supply 316.

When applied a heater voltage, a temperature of the cathode chip 311 rises and the cathode chip 311 enters a state where an electron is likely to be emitted. When further applied the cathode voltage, the cathode chip 311 emits the electron from near the tip of the cathode chip 311. The anode 313 leads the electron emitted from near the tip of the cathode chip 311 and guides the electron beam to the electron beam path.

3-2. Another Mode of Electron Gun (1)

Figure 6:
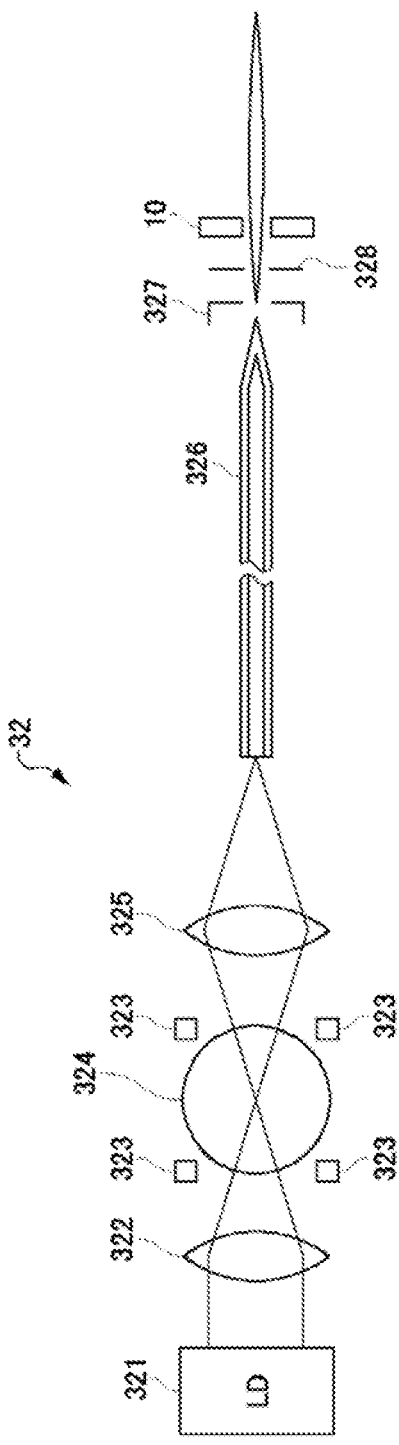
FIG. 6 illustrates a configuration of another mode of the electron gun according to the embodiment of the present invention.

FIG. 6 is a view illustrating a configuration of another mode of the electron gun. This electron gun 32 has a laser diode 321, a first lens 322, magnetic field coils 323, a gas filled tube 324, a second lens 325 and an electron emission fiber 326, and emits electrons from a tip of the electron emission fiber 326. Further, a Wehnelt 327 and an anode 328 are provided ahead of the tip of the electron emission fiber 326, and, according to these configurations, the electron gun 32 leads electrons emitted from the tip of the electron emission fiber 326 and guides the electron beams to the electron beam path.

The laser diode 321 serves as a laser light source to emit laser light. The first lens 322 condenses laser light emitted from the laser diode 321. The first lens 322 is designed and arranged to condense the laser light in the gas filled tube 324.

In the gas filled tube 324, plasma small space (spot plasma) is formed by the condensed laser light. In this case, the magnetic field coils 323 form an induction magnetic field, so that a plasma state is easily produced and a plasma shape can be controlled (for example, made round).

When the plasma small space is produced in the gas filled tube 324, electromagnetic waves (invisible light beams) such as DUV (Deep Ultraviolet), UV (Ultraviolet) and X rays are produced, condensed by the second lens 325 and input to an input terminal (a left end in FIG. 6) of the electron emission fiber 326.

Figure 7:
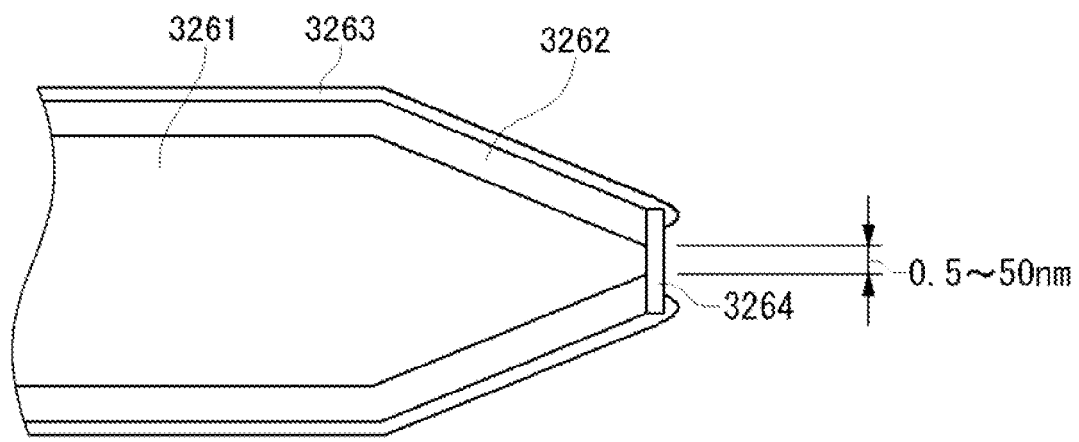
FIG. 7 is an enlarged view of a tip portion of an electron emission fiber according to the embodiment of the present invention.

FIG. 7 is an enlarged view of a tip portion of the electron emission fiber 326. The electron emission fiber 326 has a core 3261, a clad 3262, a metal coat 3263 made of, for example, Cr or CrN and a photoelectric material 3264. For the electron emission fiber 326, for example, a fiber made of a glass material or a fiber made of quartz glass can be used. A taper shape is formed near the tip of the electron emission fiber 326, and an end portion of the core 3261 is formed to have a size having the diameter of 0.5 to 50 nm at the tip. The clad 3262 is formed around the core 3261. The photoelectric material 3264 is provided at this tip, and is coated over the tip of the core 3261 and the clad 3262. In addition, the photoelectric material 3264 may be coated only over the tip of the core 3261. The photoelectric material 3264 is made of Au or Ru, and has the thickness of 10 to 20 nm. When light is incident on the photoelectric material 3264, the photoelectric material 3264 emits the amount of electrons matching the amount of light.

The metal coat 3263 is formed on an outer side of the clad 3262 and in a peripheral portion of the photoelectric material 3264 (a portion at which the photoelectric material 3264 coats the tip of the clad 3262). The metal coat 3263 is connected to a power supply of 0 to −10 kV. When overlapping the peripheral portion of the photoelectric material 3264, the metal coat 3263 is also electrically connected with the photoelectric material 3264. Further, the metal coat 3263 overlaps the peripheral portion of the photoelectric material 3264, so that it is possible to prevent DUV leaking from the core 3261 from widening a portion at which photoelectrons are produced. According to this configuration, the metal coat 3263 functions as an electrically-conductive line which electrically connects the power supply and the photoelectric material 3264, and applies the voltage of the power supply to the photoelectric material 3264.

An invisible light beam such as DUV, UV or an X ray incident from the input terminal of the electron emission fiber 326 employing this configuration to the core 3261 travels toward an output terminal (a right end in FIG. 6) repeating total reflection at a boundary between the core 3261 and the clad 3262. The invisible light beam such as DUV, UV or an X ray having propagated in the core 3261 is incident on the photoelectric material 3264 at a tip portion of the electron emission fiber 326. The photoelectric material 3264 emits an electron matching the intensity of this incident invisible light beam such as DUV, UV or an X ray.

The electron emitted from the tip of the electron emission fiber 326, that is, from the photoelectric material 3264, is led by the Wehnelt 327 and the anode 328, and guided to the electron beam path formed by the first deflector 10 and the other elements.

Among these components of the electron gun 32, what needs to be accommodated in vacuum, that is, in the electron gun housing 60, are only the tip portion of the electron emission fiber 326, the Wehnelt 327 and the anode 328, and the other components can be arranged in atmosphere. Hence, the electron gun 32 has an advantage of reducing the interval between electron beams and forming more electron beam irradiation detecting systems in a limited range in the electron column 907 in the multiple SEM structure in which a plurality of electron beam irradiation detecting systems are formed in one electron column 907.

Further, the above TFE electron gun 31 has a concern that, when an output is increased, electrons are emitted not only from the tip of the cathode chip but also from around the tip, electron beams pass unnecessary trajectories, thereby causing charging up. By contrast with this, the electron gun 32 can reliably emit an electron only from the tip of the electron emission fiber 326, it is possible to prevent or reduce blurring of an observation image caused when electron beams to be irradiated with (also referred to as "irradiation beams" below) pass undesirable trajectories, and improve resolution of the observation image compared to the TFE electron gun 31.

Further, the energy width of the electron beam irradiated from the electron gun 32 is about 0.05 to 0.5 eV and narrow, and the electron gun 32 can emit more electrons of uniform energy compared to the TFE electron gun 31.

3-3. Another Mode of Electron Gun (2)

Figure 8:
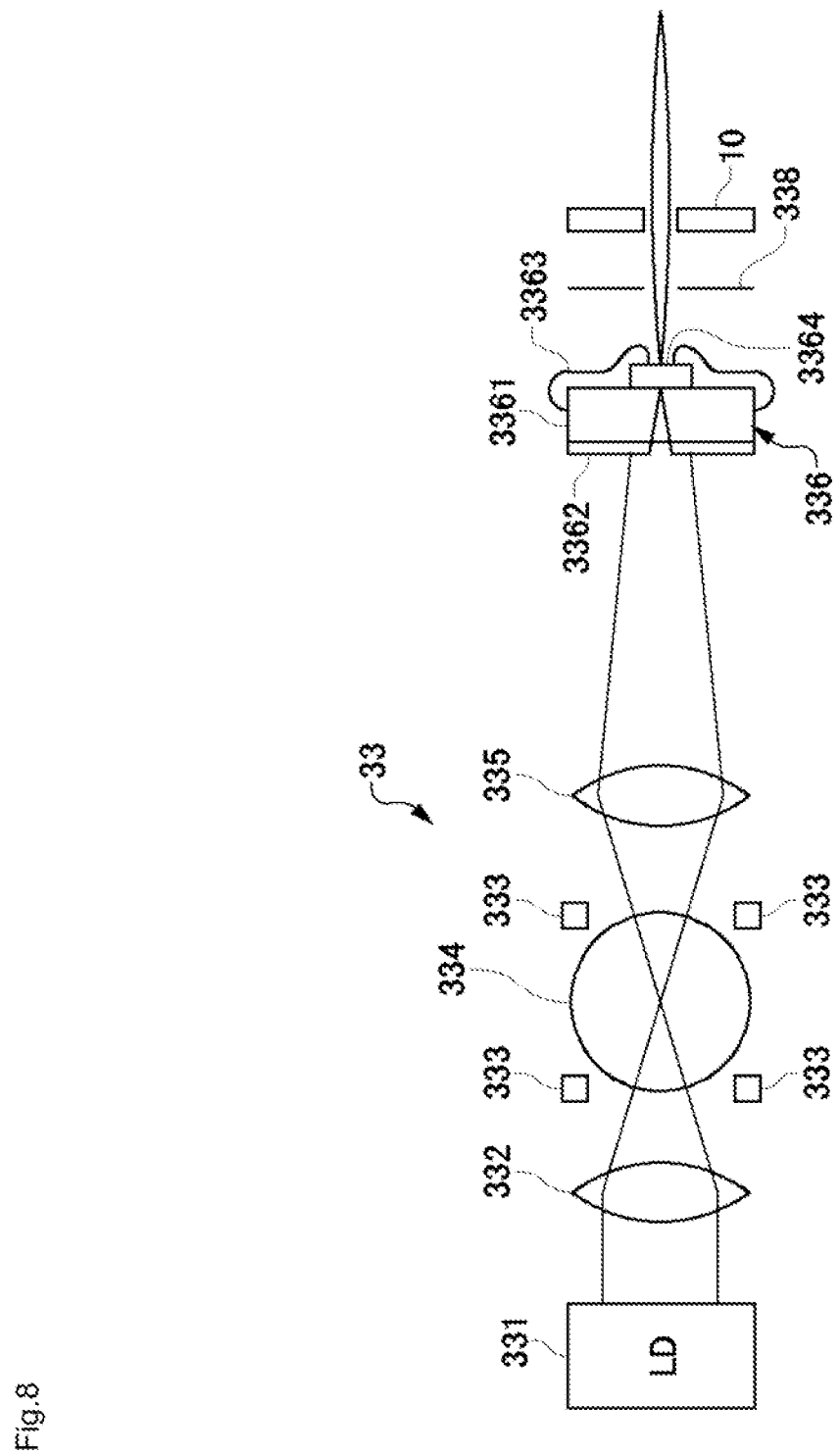
FIG. 8 illustrates a configuration of another mode of the electron gun according to the embodiment of the present invention.

FIG. 8 is a view illustrating a configuration of another mode of the electron gun. This electron gun 33 has a laser diode 331, a first lens 332, magnetic coils 333, a gas filled tube 334 and a second lens 335 similar to the electron gun 32. The electron gun 33 has an electron emitting element 336 instead of the electron emission fiber 326 of the electron gun 32, and emits electrons from an electron emission plane (output plane) of the electron emitting element 336. Further, a Wehnelt 337 and an anode 338 are provided ahead of the electron emission plane of the electron emitting element 336 to lead the electron emitted from the electron emission plane of the electron emitting element 336 and guide the electron beam to the electron beam path.

The laser diode 331 serves as a laser light source to emit laser light. The first lens 332 condenses laser light emitted from the laser diode 331. The first lens 332 is designed and arranged to condense the laser light in the gas filled tube 334. In the gas filled tube 334, plasma small space (spot plasma) is formed by the condensed laser light. In this case, the magnetic field coils 333 form an induction magnetic field, so that a plasma state is easily produced and a plasma shape can be controlled (for example, made round).

When the plasma small space is produced in the gas filled tube 334, invisible light beams such as DUV, UV and X rays are produced, condensed by the second lens 335 and input to an input plane (a plane on a left side in FIG. 8) of the electron emitting element 336.

The electron emitting element 336 has a base material 3361 made of quartz, an aperture 3362 formed on an input plane side of the base material 3361, a metal coat 3363 and a photoelectric material 3364 provided on an output plane side of the base material 3361. The photoelectric material 3364 is made of Au or Ru, and has the thickness of 10 to 20 nm. When light is incident on the photoelectric material 3264, the photoelectric material 3264 emits the amount of electrons corresponding to the amount of light.

The metal coat 3363 is formed on the output plane side of the base material 3361. The metal coat 3363 is connected to a power supply of 0 to −10 kV. When overlapping the peripheral portion of the photoelectric material 3364, the metal coat 3363 is also electrically connected with the photoelectric material 3364. According to this configuration, the metal coat 3363 functions as an electrically-conductive line which electrically connects the power supply and the photoelectric material 3364, and applies the voltage of the power supply to the photoelectric material 3364.

An invisible light beam such as DUV, UV or an X ray incident from the input plane of the electron emitting element 336 employing this configuration to the base material 3361 through the aperture 3362 travels toward an output plane (the right end in FIG. 8). The invisible light beam such as DUV, UV or an X ray having propagated in the base material 3361 is incident on the photoelectric material 3364 on the output plane side of the base material 3361. The photoelectric material 3364 emits an electron matching the intensity of this incident invisible light beam such as DUV, UV or an X ray.

The electron emitted from the output plane of the electron emitting element 336, that is, from the photoelectric material 3364 is led by the anode 338, and guided to the electron beam path formed by, for example, the first deflector 10.

Among these components of the electron gun 33, what needs to be accommodated in vacuum, that is, in the electron gun housing 60, are only the electron emitting element 336 and the anode 338, and the other components can be arranged in atmosphere. Hence, the electron gun 33 has an advantage of reducing the interval between electron beams and forming more electron beam irradiation detecting systems in a limited range in the electron column 907 in the multiple SEM structure in which a plurality of electron beam irradiation detecting systems are formed in one electron column 907.

Further, the electron gun 33 can reliably emit an electron only from the photoelectric material 3364 of the electron emitting element 336, and prevent or reduce blurring in an observation image caused when an irradiation beam passes an undesirable trajectory and improve resolution of the observation image compared to the TFE electron gun 31. Furthermore, the energy width of the electron beam irradiated from the electron gun 33 is about 0.05 to 0.5 eV and narrow, and the electron gun 33 can emit more electrons of uniform energy compared to the TFE electron gun 31. Still further, compared to the TFE electron gun 31, the electron gun 33 also has an advantage that a Wehnelt is not necessary. Moreover, the electron gun 33 adopts a simple structure, so that the electron gun 33 can be manufactured at low cost which is one third or one fifth of conventional TFE electron guns.

Moreover, the electron gun 33 provides an advantage that a Wehnelt is not used and, consequently, it is possible to increase the transmittance of a produced electron beam. That is, when the Wehnelt is provided, the size and the position of a first crossover changes due to electron energy, a Wehnelt voltage and an anode voltage, an irradiation beam widens and, as a result, the transmittance deteriorates. By contrast with this, the electron gun 33 does not use a Wehnelt and, consequently, can increase the transmittance of a produced electron beam by using the photoelectric material 3364 as a substantial light source.

4. Electrostatic Lens

The condenser lens 11 and the objective lens 16 are electrostatic lenses. Generally, although the condenser lens 11 and the objective lens 16 can be magnetic field lenses, the magnetic lens employs a configuration where yokes are wound around coils, which makes an electron column larger. According to the present embodiment, the electron column 907 is configured as a multiple SEM as described above, and a plurality of electron beam irradiation detecting systems are formed in one cylindrical body 50. The electrostatic lenses are adopted with the present embodiment, so that it is possible to provide more electron beam irradiation detecting systems in a limited range without making the electron column 907 larger as in case of the magnetic field lenses and, thereby, increase the number of electron beams with which a sample can be simultaneously irradiated (which can simultaneously scan the sample).

Further, in case of the magnetic field lens, the magnetic field leaks outside and interferes with other electron beam irradiation detecting systems nearby. In the multiple SEM including a plurality of electron beam irradiation detecting systems in one cylindrical body 50, a distance between adjacent electron beam irradiation detecting systems becomes relatively close (for example, 10 to 30 mm), and therefore an influence of magnetic field leakage becomes significant. By contrast with this, according to the present embodiment, by adopting the electrostatic lenses in the electron column 907 of the multiple SEM, it is possible to avoid an influence on the other electron beam irradiation detecting systems due to such magnetic field leakage. When these electrostatic lenses are adopted, the S/N ratio is improved five-fold to thirty-fold compared to a case that the magnetic field lenses are adopted, and it is possible to perform an inspection at 100 to 200 electron/pixel. This is mainly because it is possible to reduce energy dispersion even when a current value is increased and increase the transmittance of a primary beam lens system, and there is no factor which causes noise of a leaking magnetic field due to the magnetic field lenses.

In addition, in case of one SEM which irradiates a sample with one beam, a boost time it takes until an SEM operation is performed after assembly or attachment to, for example, a vacuuming device is short. The magnetic field type is susceptible to an influence of a temperature change and a resistance change of electromagnetic coils and yokes therearound, and requires the time to become stable. The electrostatic type employs a constant voltage power supply, and can immediately apply a stable set voltage. Such a loss time is reduced to about one fiftieth to one one-hundred-twentieth compared to the magnetic field type. Further, an irradiation beam rotates accompanying a change in energy of an electron beam or a lens magnetic field according to the magnetic field type and a deflection direction of the deflector changes, and therefore it is necessary to make adjustment to correct the deflection direction when necessary. By contrast with this, according to the electrostatic type, an irradiation beam does not rotate and the deflection direction does not fluctuate, so that beams can be deflected stably in the x and y directions. Further, as described above, the electrostatic type enables a smaller size and a stable operation. Consequently, when a plurality of optical systems is aligned, more optical systems can be disposed in a unit area. That is, it is possible to provide a multiple SEM in which a distance between irradiation beams is short.

Further, for the same reason, the first deflector 10, the second deflector 12, the third deflector 15, the fourth deflector 17 and the fifth deflector 18 are electrostatic deflectors. By this means, it is possible to make the device smaller as described above and avoid an influence due to magnetic field leakage.

5. Spacer

As described above, the spacers 20 to 28 are disposed between parts in the cylindrical body 50 such that the distance between the parts adjacent in the upper and lower directions is a predetermined distance. The spacers 20 to 28 are made of conductive ceramic. Resistances of the spacers 20 to 28 are $10^9$ to $10^{12}$ Ωcm. Preferably, the resistances of the spacers 20 to 28 are $10^{10}$ to $10^{11}$ Ωcm. Further, the cylindrical body 50 is also made of the same material as the spacers 20 to 28. Thus, when the spacers 20 to 28 and the cylindrical body 50 are made of ceramic, it is possible to suppress thermal expansion low. Further, when all spacers 20 to 28 are made of ceramic, it is possible to make the coefficients of thermal expansion of all spacers 20 to 28 the same, and suppress of thermal expansion of the electron column 907 low as a whole. Furthermore, when the cylindrical body 50 and the parts 10 to 19 are made of the same material, it is possible to suppress the influence of thermal expansion of the electron column 907 lower as a whole.

Still further, the ceramic can provide precision at a submicron level, so that, when all spacers 20 to 28 are made of the ceramic of the same material, it is possible to make precision such as concentricity upon assembly of the electron column 907 the same level (submicron level) as precision of the spacers 20 to 28 without an influence on precision of metal. Moreover, when the cylindrical body 50 and the parts 10 to 19 are also made of the same materials as the spacers 20 to 28, it is possible to further improve assembly precision of the electron column 907.

Figure 9:
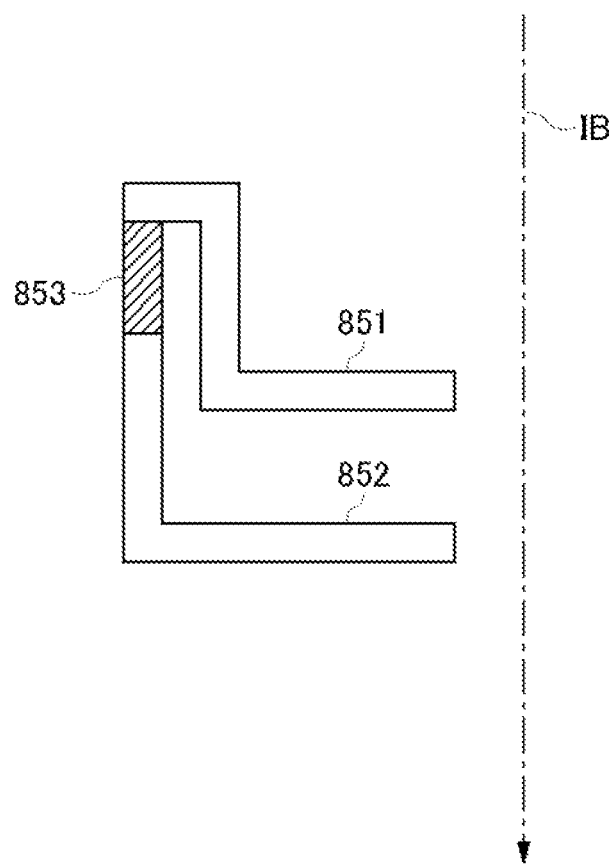
FIG. 9 illustrates a conventional spacer arrangement structure.

Moreover, the spacers have high resistances, thereby contributing to making the electron column smaller. FIG. 9 illustrates a conventional spacer arrangement structure. Although a spacer 853 is provided between an upper part 851 and a lower part 852 in the conventional structure in FIG. 9, the spacer is arranged at a position at which the spacer is hidden from an irradiation beam IB, and therefore the electron column becomes larger. By contrast with this, according to the present embodiment, spacers made of ceramic of high resistance are adopted, so that it is possible to expose the spacers 20 to 28 to irradiation beams, arrange the spacers directly between the flat parts as illustrated in FIG. 1 and save space.

6. Wiring Structure

Next, a wiring structure in each of the parts 10 to 19 in the electron column 907 will be described. In each of the parts 10 to 19, an electrically-conductive line which electrically connects with a power supply needs to be led to an outside of the cylindrical body 50.

6-1. Vertical Cross-Sectional Structure of Wiring

Hereinafter, a vertical cross-sectional structure of a wiring in the electron column according to the present embodiment will be described using the condenser lens 11 as an example.

6-1-1. Condenser Lens 11 is Made of Metal

Figure 10:
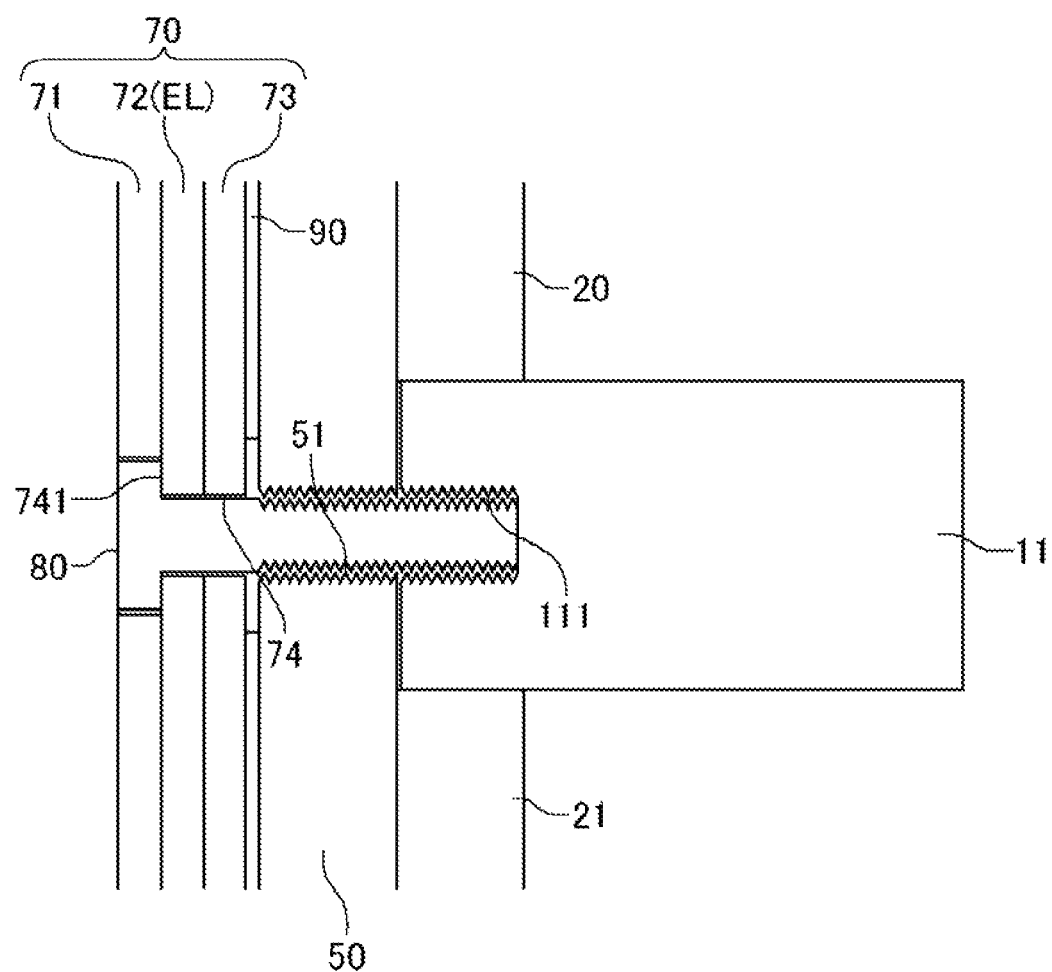
FIG. 10 is an enlarged vertical cross-sectional view of a peripheral portion of a condenser lens according to the embodiment of the present invention.
Figure 11:
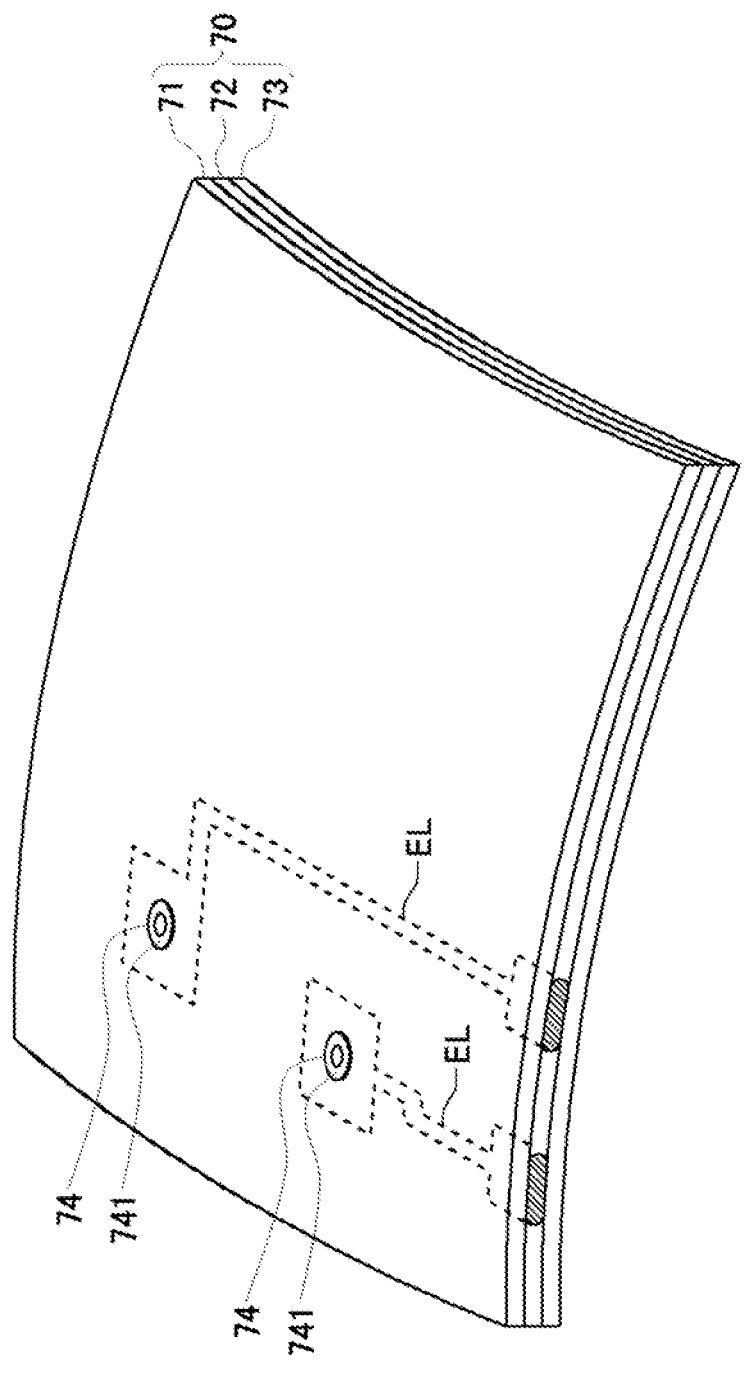
FIG. 11 illustrates a partial area of a FPC according to the embodiment of the present invention.

FIG. 10 is an enlarged vertical cross-sectional view of a peripheral portion of the condenser lens 11. FIG. 10 illustrates an example of a wiring structure in case that the condenser lens 11 is made of metal. In the cylindrical body 50, a flexible printed cable (FPC) 70 which serves as a wiring film is provided along the outer peripheral of the cylindrical body 50 to cover the outer peripheral surface. FIG. 11 is a view illustrating a partial area of the FPC 70. The FPC 70 has a three layer structure of a polyimide resin layer 71, an electrically-conductive formation layer 72 and a polyimide resin layer 73. An electrically-conductive line EL made of copper is formed in the electrically-conductive formation layer 72.

In the FPC 70 and the cylindrical body 50, wiring holes 74 and 51 are provided at positions meeting a terminal of the condenser lens 11, and a conductive contact pin 80 is inserted in these wiring holes 74 and 51. A screw thread is formed at a shaft portion of the contact pin 80, a screw groove is formed in the wiring hole 51 of the cylindrical body 50 and, when the contact pin 80 and the cylindrical body 50 are screwed, the contact pin 80 is held by the cylindrical body 50.

The wiring hole 74 has the same size as or a larger size than the diameter of a head portion of the contact pin 80 in the polyimide resin layer 71 and has the same size as or a larger size (smaller than the diameter of the head portion) than the diameter of the shaft portion of the contact pin 80 in the electrically-conductive formation layer 72 and the polyimide resin layer 73, and a flange portion 741 is formed on an outer surface of the electrically-conductive formation layer 72. When the contact pin 80 and the cylindrical body 50 are screwed and the head portion of the contact pin 80 abuts on the flange portion 741 of the FPC 70, the contact pin 80 and the electrically-conductive line EL are electrically connected, and the contact pin 80 is positioned in the thickness direction of the cylindrical body 50.

The condenser lens 11 is made of metal, and functions as an electrode itself. In the condenser lens 11, a contact hole 111 is formed as a terminal at a position meeting the wiring holes 74 and 51, and a screw groove is formed in the inner surface of the contact hole 111. When the contact pin 80 is screwed with the screw groove of the wiring hole 51 and is screwed with the contact hole 111 ahead of the screw groove, and the front end of the contact pin 80 abuts on the bottom of the contact hole 111, the metal condenser lens 11 and the contact pin 80 electrically connect.

According to the above configuration, the electrically-conductive line EL and the condenser lens 11 are electrically connected through the contact pin 80. The electrically-conductive line EL is formed in the electrically-conductive formation layer 72 inside the FPC 70 as illustrated in FIG. 11, and is connected with the power supply through an external wiring at an adequate portion. That is, the electrically-conductive line EL formed in the electrically-conductive formation layer 72 connects the external power supply to the parts of the electron column 907 through the contact pin 80.

Further, the surface of the cylindrical body 50 and/or the back surface of the FPC 70 other than the wiring holes 74 and 51 are applied a metal ground coating 90. The voltage supplied from the above wiring structure is 100 V to about 10000 V at maximum, and therefore, if a little gap is formed between the cylindrical body 50 and the FPC 70, a spark occurs therebetween, thereby damaging the parts and the FPC 70. This ground coating 90 can prevent a spark from occurring by discharging to the ground a high voltage to be applied to the gap between the cylindrical body 50 and the FPC 70.

6-1-2. Focusing Lens 11 is Plated With Metal

Figure 12:
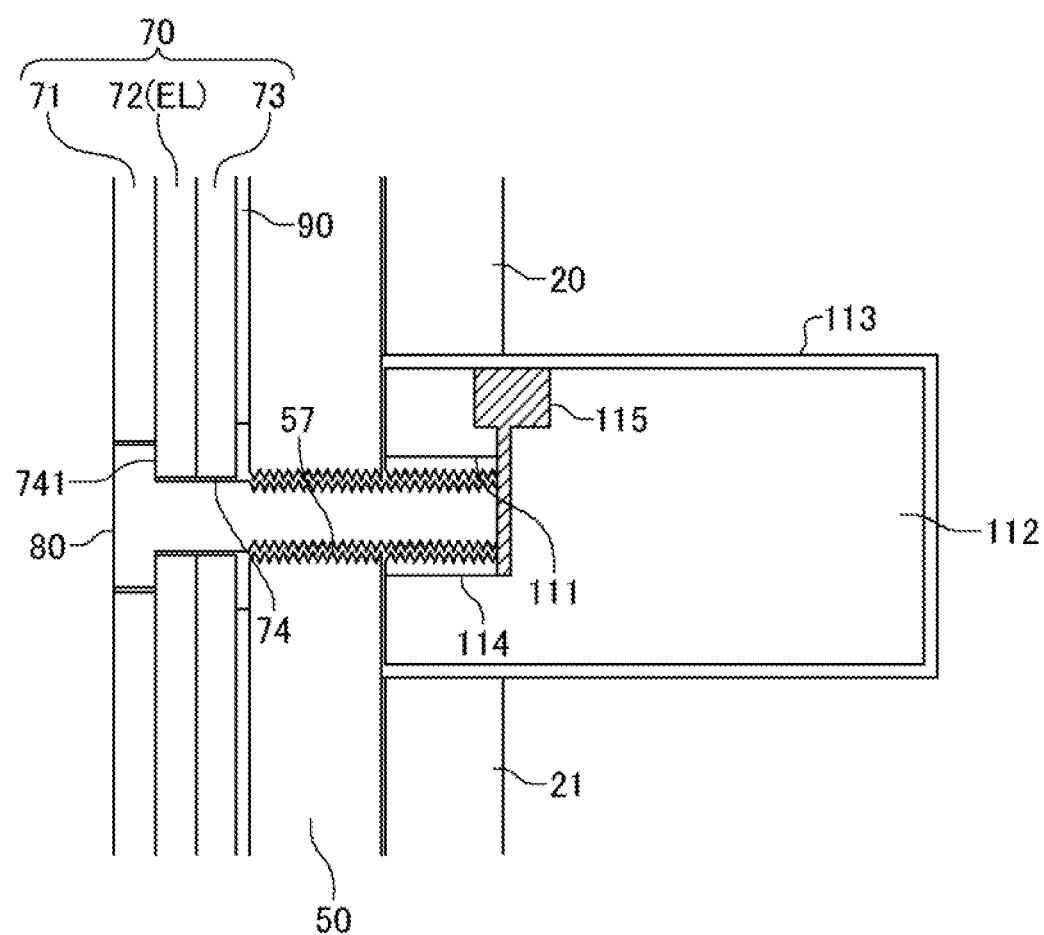
FIG. 12 is an enlarged vertical cross-sectional view of the peripheral portion of the condenser lens according to the embodiment of the present invention.

FIG. 12 is an enlarged vertical cross-sectional view of the peripheral portion of the condenser lens 11. FIG. 12 illustrates an example of a wiring structure in case that the condenser lens 11 is plated with metal. In the cylindrical body 50, the flexible printed cable (FPC) 70 which serves a wiring film illustrated in FIG. 11 is provided along the outer peripheral of the cylindrical body 50 to cover the outer peripheral surface.

In the FPC 70 and the cylindrical body 50, the wiring holes 74 and 51 are provided at positions meeting the condenser lens 11, and the conductive contact pin 80 is inserted in these wiring holes 74 and 51. A screw thread is formed at a shaft portion of the contact pin 80, a screw groove is formed in the wiring hole 51 of the cylindrical body 50 and, when the contact pin 80 and the cylindrical body 50 are screwed, the contact pin 80 is held by the cylindrical body 50.

When the contact pin 80 and the cylindrical body 50 are screwed and the head portion of the contact pin 80 abuts on the flange portion 741 of the FPC 70, the contact pin 80 and the electrically-conductive line EL are electrically connected, and the contact pin 80 is positioned in the thickness direction of the cylindrical body 50.

The condenser lens 11 adopts a structure in which a metal plating 113 which serves as an electrically-conductive line is applied to a surface of an insulator (more specifically, ceramic) body 112. In the condenser lens 11, the contact hole 111 is formed as a terminal at a position meeting the wiring holes 74 and 51. In the contact hole 111, a cylindrical metal bush 114 in which a screw groove is formed in an inner peripheral surface is pressed fit. In the bottom of the contact hole 111, a via 115 which is electrically connected to the metal plating 113 is formed. The via 115 is formed by forming in the surface of the body 112 a via hole which communicates to the contact hole 111 and injecting metal in this via hole. The via 115 is injected from the via hole and reaches the bottom of the contact hole 111. The metal plating 113 is formed on the surface of the body 112 in which the via 115 has already been formed, and the metal plating 112 and the via 115 are electrically connected.

According to the above configuration, the electrically-conductive line EL and the metal plating 113 of the condenser lens 11 are electrically connected through the contact pin 80 and the via 115. The electrically-conductive line EL is formed in the electrically-conductive formation layer 72 inside the FPC 70 as illustrated in FIG. 11, and is connected with the power supply through an external wiring at an adequate portion. That is, the electrically-conductive line EL formed in the electrically-conductive formation layer 72 connects the external power supply to the parts of the electron column 907 through the contact pin 80.

Further, the surface of the cylindrical body 50 and/or the back surface of the FPC 70 other than the wiring holes 74 and 51 are applied the metal ground coating 90. The voltage supplied from the above wiring structure is 100 V to about 10000 V at maximum, and therefore, if a little gap is formed between the cylindrical body 50 and the FPC 70, a spark occurs therebetween, thereby damaging the parts and the FPC 70. This ground coating 90 can prevent a spark from occurring by discharging to the ground a high voltage to be applied to the gap between the cylindrical body 50 and the FPC 70.

According to the above configuration, the body 112 of the condenser lens 11 is made of ceramic, so that, as described above, the amount of deformation due to thermal expansion of ceramic is a little and high precision at a submicron level can be realized. Further, when the body 112 of the condenser lens 11 is made of ceramic and the spacers 20 to 28 and the cylindrical body 50 are also made of ceramic, it is possible to make the coefficients of thermal expansion of these parts the same and provide precision such as concentricity upon assembly of the electron column 907 at the submicron level.

6-2. Horizontal Cross-Sectional Structure of Wiring

Next, a horizontal cross-sectional structure of a wiring to each of the parts 10 to 19 in the electron column 907 will be described.

6-2-1. Condenser Lens

Figure 13:
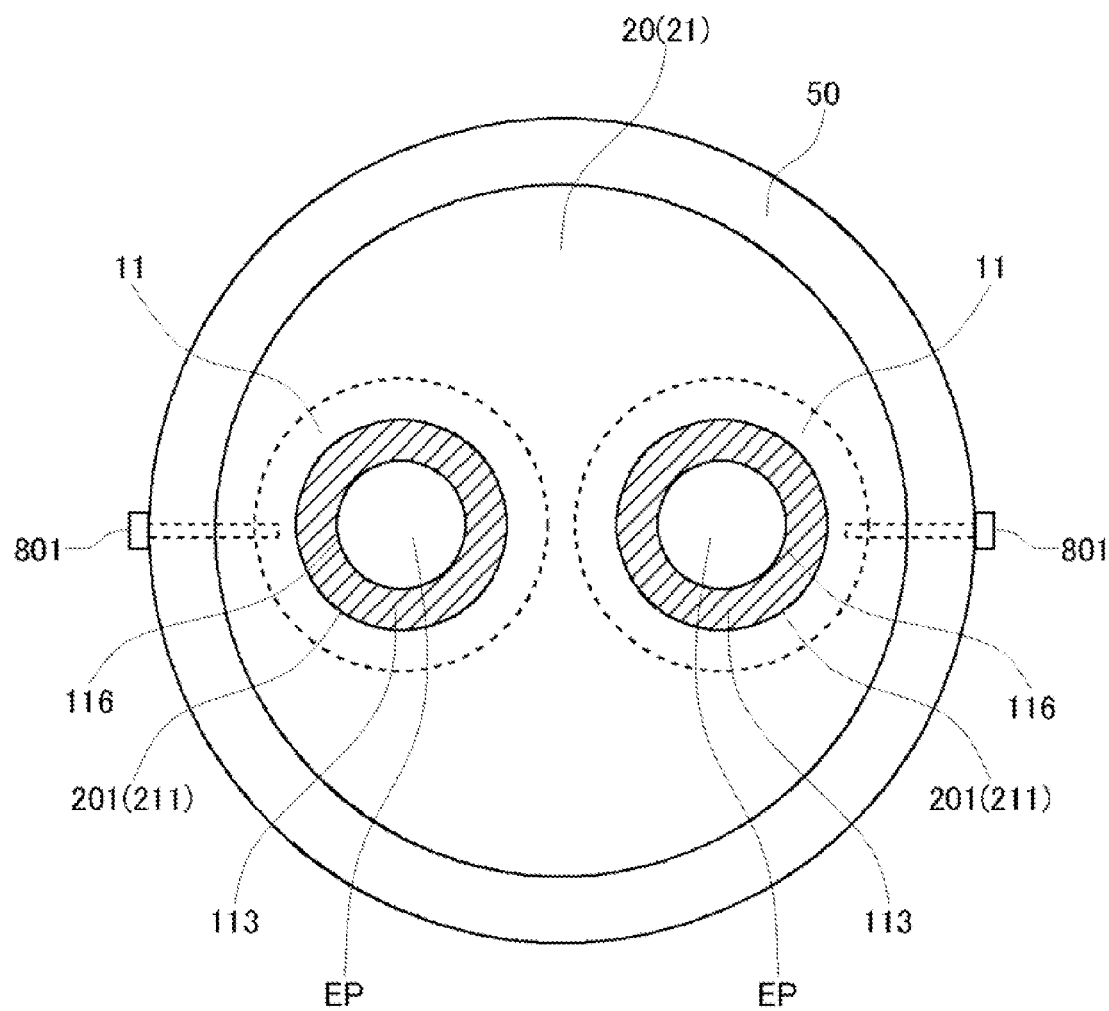
FIG. 13 illustrates a cross-sectional structure of a wiring of the condenser lens according to the embodiment of the present invention.

First, a horizontal cross-sectional structure of a wiring of the condenser lens 11 will be described. A case will be described below where two electron beam irradiation detecting systems are formed in one electron column. FIG. 13 is a view illustrating a cross-sectional structure of a wiring of the condenser lens. As illustrated in FIG. 13, inside the cylindrical body 50 of the electron column 907, the two electron beam irradiation detecting systems are formed side by side.

The spacers 20 and 21 arranged on an upper side and a lower side of the condenser lens 11 have outer peripheral shapes matching the inner periphery of the cylindrical body 50. In the spacers 20 and 21, circular holes 201 and 211 are formed meeting the electron beam paths EP of the electron beam irradiation detecting systems. The condenser lens 11 is provided between the spacers 20 and 21. With an example in FIG. 13, the condenser lens 11 is formed by covering the body 112 made of ceramic by the metal plating 113. The body 112 of the condenser lens 11 has an outer peripheral shape matching the inner periphery of the cylindrical body 50.

In the body 112 of the condenser lens 11, the metal plating 113 larger than the holes 201 and 211 of the spacers 20 and 21 covers positions meeting the holes 201 and 211 of the spacers 20 and 21. The metal plating 113 serves as an electrode of each condenser lens 11. The respective electrodes of the two condenser lenses 11 are electrically separated.

In the body 112 of the condenser lens 11, circular holes 116 smaller than the holes 201 and 211 of the spacers 20 and 21 are formed at positions meeting the holes 201 and 211 of the spacers 20 and 21. These holes 201, 116 and 211 form the electron beam paths EP. The condenser lenses 11 (the metal plating 113 portions, that is, the electrodes) in which the holes 116 are formed are exposed from the holes 201 and 211 formed in the spacers 20 and 21.

The number of electrodes of the condenser lens 11 is one, and the number of wirings to the electrodes is one per condenser lens 11. As illustrated in FIG. 13, the wiring to this electrode can be led outside the cylindrical body 50 from a portion of the condenser lens 11 closest to the cylindrical body 50. In addition, FIG. 13 does not illustrate the FPC 70 provided in the outer periphery of the cylindrical body 50. With the example in FIG. 13, as described using FIG. 10, a contact pin 801 is directly screwed in the condenser lens 11 to realize electrical contact between the electrode and the contact pin 801 in the condenser lens 11.

In addition, the above embodiment can be modified. For example, electrically-conductive lines are led from the electrodes of the two condenser lenses 11 and are joined in the cylindrical body 50, and these electrically-conductive lines then may be led outside the cylindrical body 50 using one contact pin 801. In this case, one contact pin 801 can be screwed in the cylindrical body 50 from, for example, an intermediate position of the two electron beam irradiation detecting systems. Further, by having the electrodes of the condenser lenses 11 contact, one electrode and the contact pin 801 may be electrically connected.

Furthermore, according to the embodiment, the two condenser lenses 11 are formed by covering by the metal platings 113 the positions meeting the two electron beam irradiation detecting systems in the body 112 made of ceramic. In case that the body is made of metal, only one contact pin 801 needs to be connected to the body made of metal.

6-2-2. Deflector

Next, the horizontal cross-sectional structure of a wiring of the deflector will be described.

6-2-2-1. One Electron Beam Irradiation Detecting System is Formed in One Electron Column First, a wiring structure of a deflector in case that one electron beam irradiation detecting system is formed in one electron column 907 will be described.

6-2-2-1-1. Deflector is Made With Metal

Figure 14:
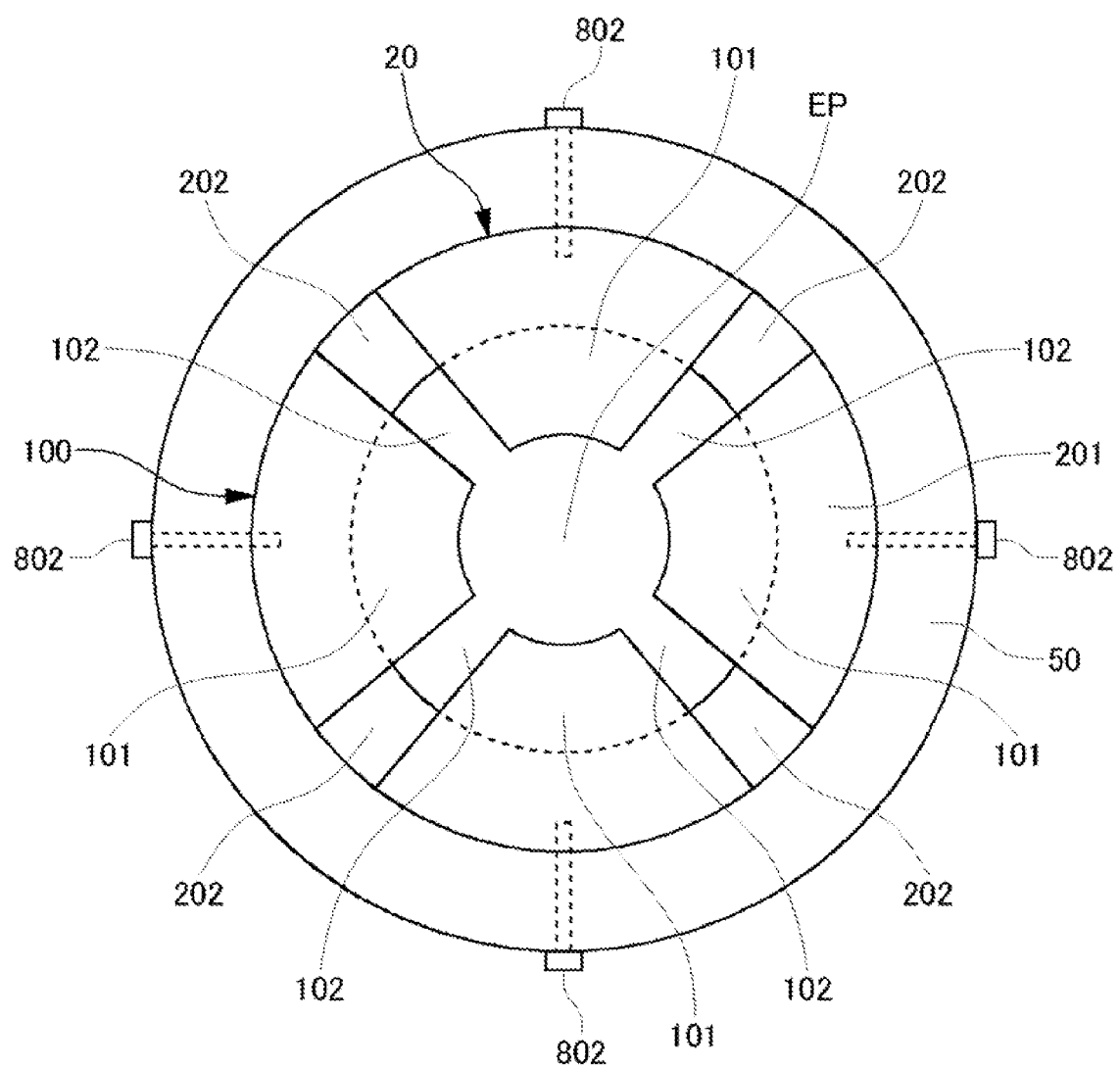
FIG. 14 illustrates a wiring structure in case that a first deflector is made of metal according to the embodiment of the present invention.

FIG. 14 is a view illustrating a wiring structure in case that the deflector itself is made of metal. FIG. 15 is an exploded perspective view illustrating the deflector and the spacer below the deflector. A deflector 100 in this example has four electrodes. The deflector 100 is divided into four electrodes 101 each having a fan shape. The outer periphery of each electrode 101 matches with the inner periphery of the cylindrical body 50. Each electrode 101 is arranged with a gap 102 to each other while having the outer periphery abut on the inner periphery of the cylindrical body 50, and a circular hole which forms the electron beam path EP is formed in the center portion.

A spacer 200 provided below the deflector 100 has a donut-shaped vertical direction spacer portion 201 for securing space with respect to a lower part, and four circumferential direction spacer portions 202 which are upright from the vertical direction spacer portion 201 to secure spaces between adjacent electrodes. Each electrode 101 of the deflector 100 is arranged on the lower part through the vertical direction spacer portion 201 of the spacer 200, and is arranged spaced with the gap 102 apart from each other through the circumferential direction spacer portion 202 of the spacer 200.

The contact pin 802 is screwed in each electrode 101 from an outside of the cylindrical body 50 to secure electrical connection between each contact pin 802 and each electrode 101. A connection structure between the electrode 101 and the contact pin 802 is as described using FIG. 10. In addition, the FPC 70 is not illustrated in FIG. 14, either.

6-2-2-1-2. Deflector is Plated With Metal

Figure 16:
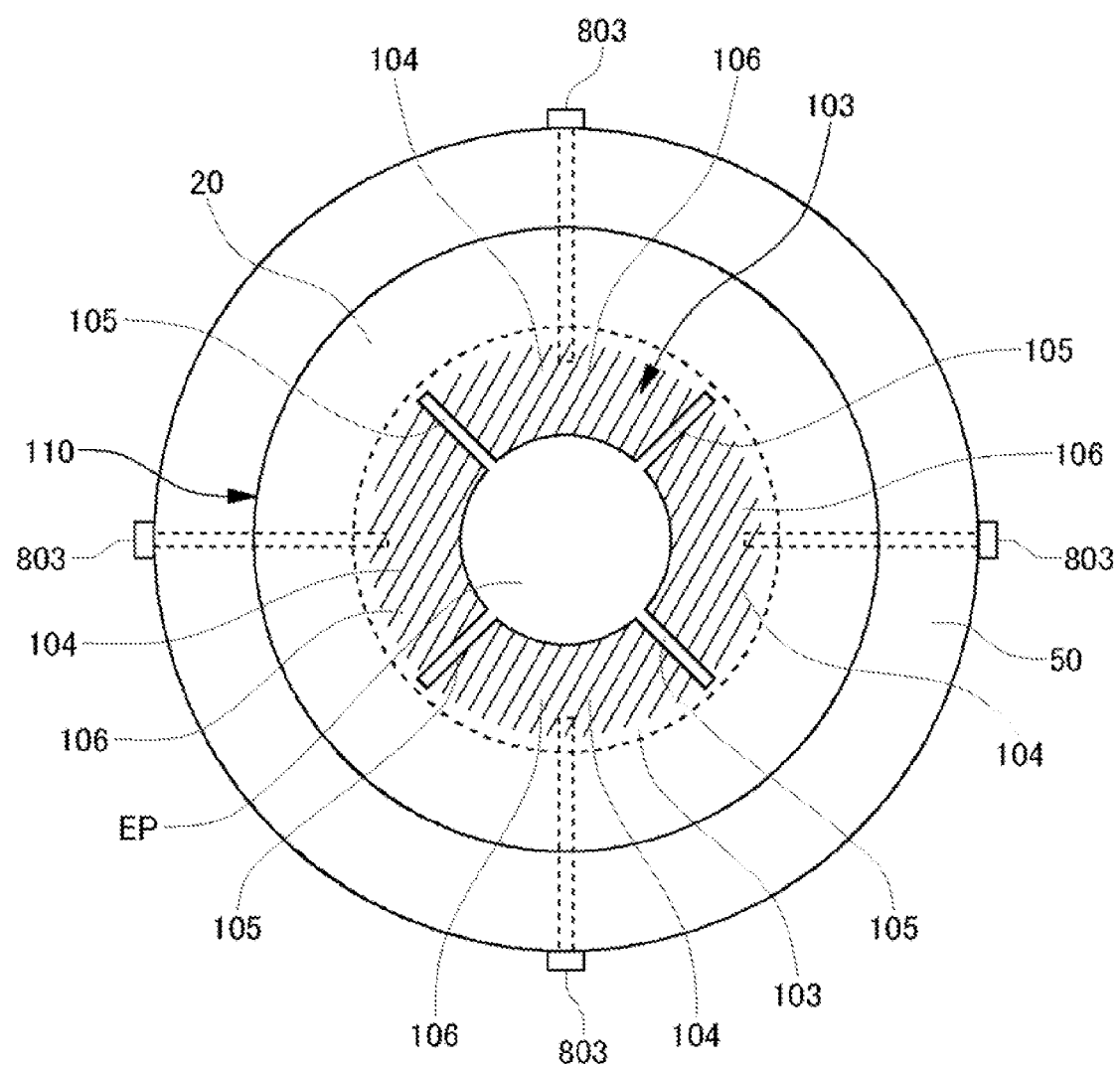
FIG. 16 illustrates a wiring structure in case that the first deflector has a body and metal platings formed on a surface of the body according to the embodiment of the present invention.

FIG. 16 illustrates a wiring structure in case that the deflector 110 has the body 103 made of ceramic and the metal plating 106 formed on a surface of the body. Also, in this example, four electrodes are formed in the deflector 110. The body 103 of the deflector 110 has a donut shape in which a circular hole is opened in the center, and cutouts 105 are cut in four directions from this hole. The electrodes 104 are formed between the adjacent cutouts 105. The metal platings 106 cover the surrounding of the circular hole. The metal platings 106 are separated by the cutouts 105 to form the four electrodes 104.

The spacer 210 arranged below the deflector 110 has a donut shape in which a hole larger than the hole of the deflector 110 is formed inside.

A contact pin 803 is screwed in each electrode 104 from an outside of the cylindrical body 50 to secure electrical connection between each contact pin 803 and each electrode 104. A connection structure between the metal plating 106 of the electrode 104 and the contact pin 803 is as described using FIG. 12. In addition, the FPC 70 is not illustrated in FIG. 16, either.

6-2-2-2.1 A Plurality of Electron Beam Irradiation Detecting Systems are Formed in One Electron Column Next, a wiring structure of a deflector in case that a plurality of one electron beam irradiation detecting systems are formed in one electron column will be described using the first deflector 10 as an example. As described using FIGS. 14 and 16, when one electron beam irradiation detecting system is formed in one electron column, a contact pin can be directly connected to electrodes. That is, the contact pin penetrates the cylindrical body 50 from the upper side and reaches the upper electrode, the contact pin penetrates the cylindrical body 50 from the right side and reaches the right electrode, the contact pin penetrates the cylindrical body 50 from the under side and reaches the lower electrode and the contact pin penetrates the cylindrical body 50 from the left side and reaches the left electrode, so that the contact pins are arranged in a radial pattern from each electrode and a wiring can be led to an outside of the cylindrical body 50. However, when a plurality of electron beam irradiation detecting systems are formed in one cylindrical body 50, there are a plurality of deflectors, and therefore it is not possible to provide contact pins in a radial pattern from the electrodes and lead the wirings to an outside of the cylindrical body 50. Hence, the wiring adopts the structure described below with the present embodiment.

Figure 17:
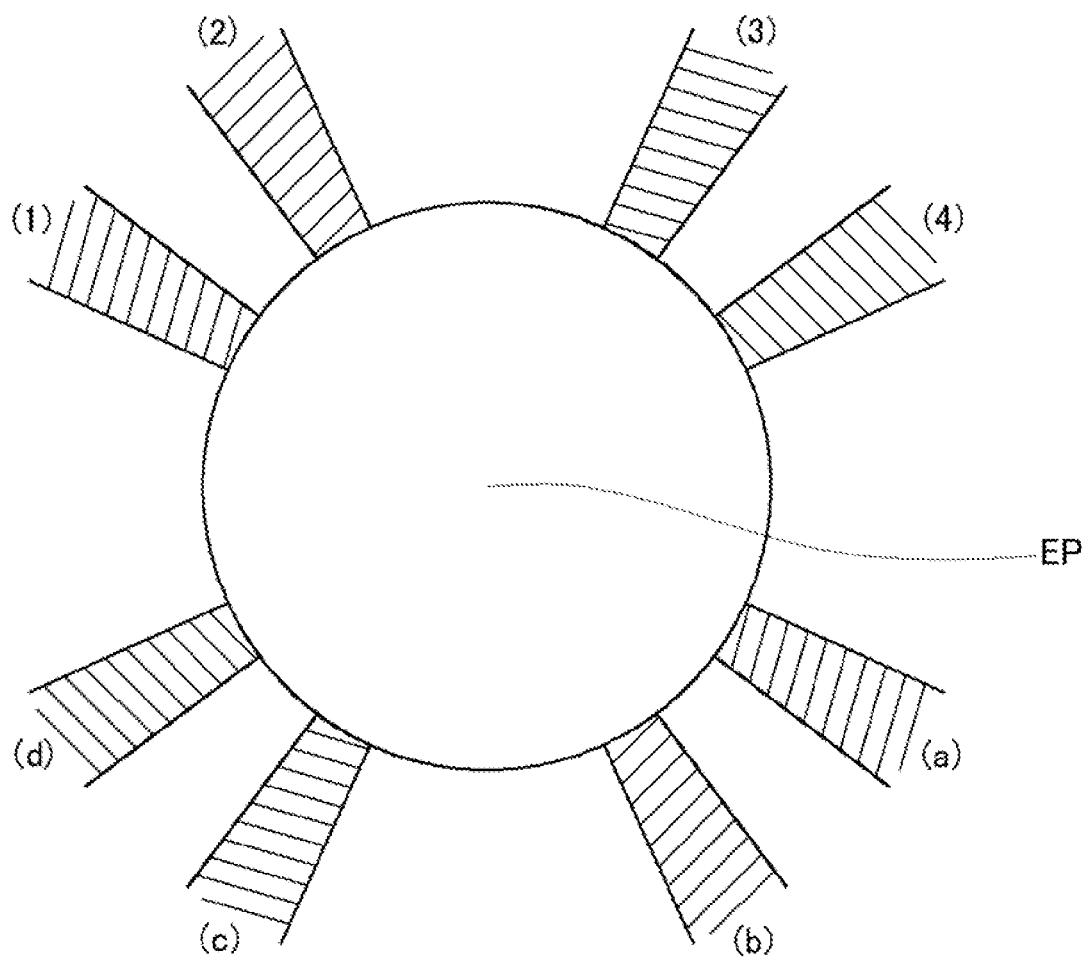
FIG. 17 is a view for describing a relationship between applied voltages in case that the first deflector has eight electrodes according to the embodiment of the present invention.

First, the electrode of the deflector will be described. FIG. 17 is a view for describing a relationship between applied voltages in case that the first deflector 10 has eight electrodes. The first deflector 10 applies voltages which have the same magnitude and the signs of which are opposite to each other, to the electrodes which oppose to each other across the electron beam path EP. With an example in FIG. 17, an electrode (1) and an electrode (a) are at opposite positions across the electron beam path EP, and are applied voltages which have the same magnitude and the signs of which are inverted. For example, the electrode (1) and the electrode (a) are applied voltages of 30 V and −30 V, respectively. Similarly, the electrode (2) and the electrode (b), the electrode (3) and the electrode (c), and the electrode (4) and the electrode (d) are likewise applied voltages which have the same magnitude and the signs of which are inverted.

Further, electrically-conductive lines from the opposing electrodes which are applied voltages which have the same magnitude and the signs of which are inverted are desirably led to the outside of the cylindrical body 50 from positions close to each other. According to the present embodiment, the wiring structure is devised taking these points into account.

Figure 18:
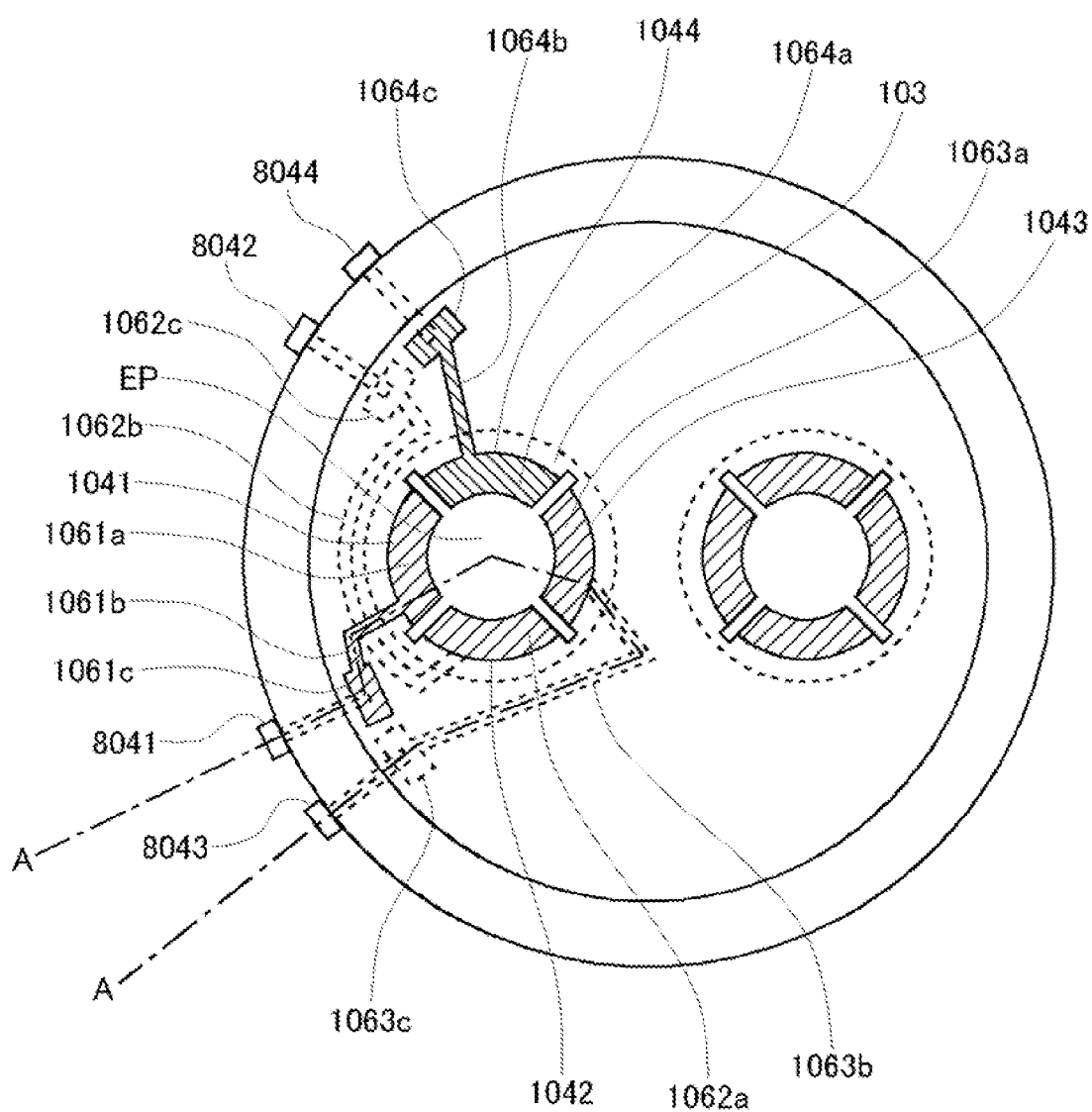
FIG. 18 illustrates the wiring structure of the first deflector in case that two electron beam irradiation detecting systems are formed in one electron column according to the embodiment of the present invention.

FIG. 18 illustrates the wiring structure of the first deflector 10 in case that two electron beam irradiation detecting systems are formed in one electron column. Although two first deflectors 10 are formed in the cylindrical body 50 in FIG. 18, both of the first deflectors 10 are symmetrical, and therefore the wiring structure of only the first deflector 10 on the left side will be illustrated for ease of illustration, will be assigned reference numerals and will be described.

With an example in FIG. 18, the two first deflectors 10 each have four electrodes. Although the two first deflectors 10 each have four electrodes with the example in FIG. 18, for example, eight first deflectors 10 are formed in one electron column as illustrated in FIG. 3 in some cases, and one first deflector 10 has eight electrodes as illustrated in FIG. 17 in some cases. In this case, the number of the electrodes is 64 in total. When the number of electrodes increases, electrically-conductive lines from these electrodes to the outside of the cylindrical body 50 need to be formed such that positions to lead electrically-conductive lines to the outside of the cylindrical body 50 from electrodes which are arranged to oppose to each other without interfering each other and the signs of which are inverted are closer.

Figure 19:
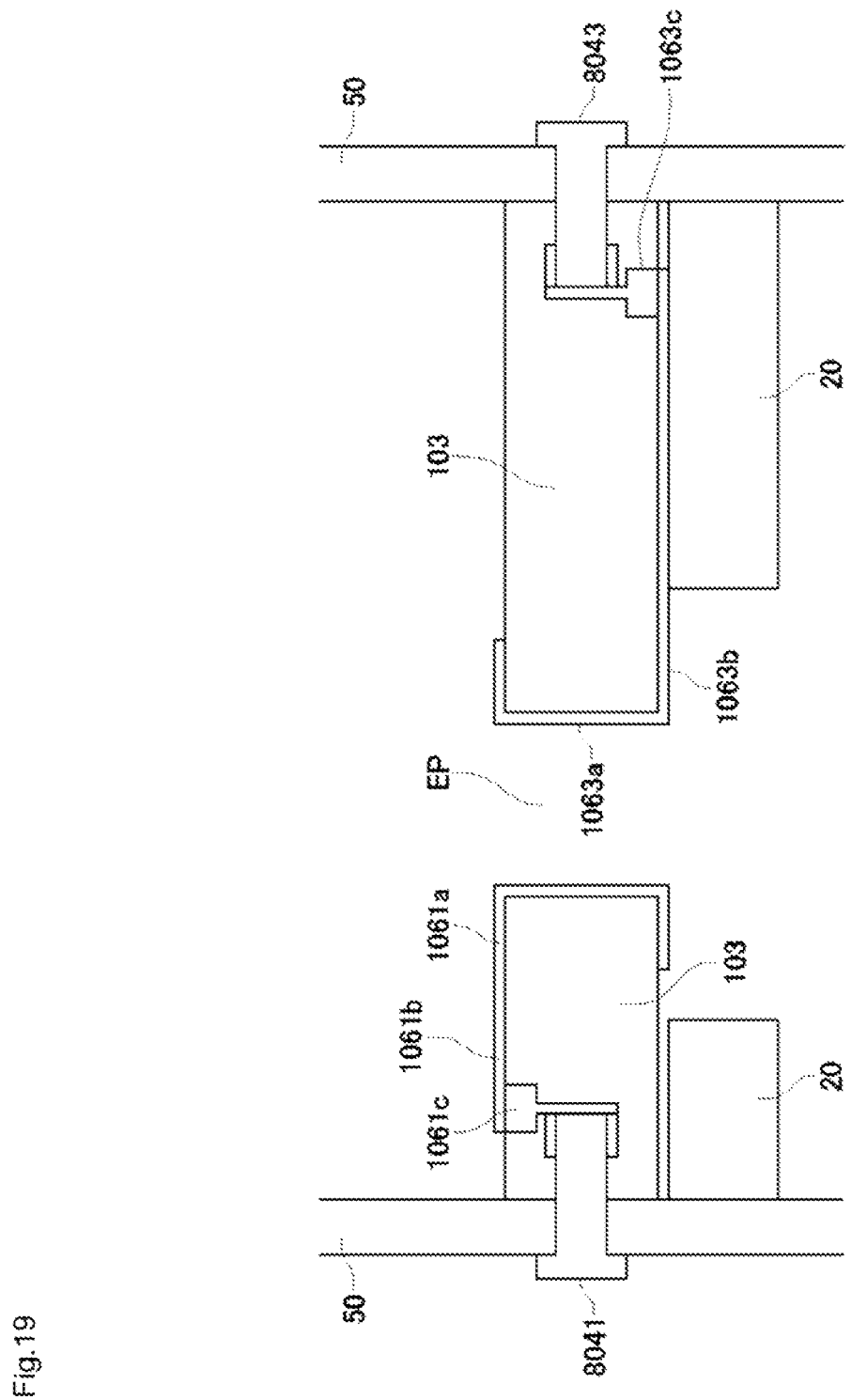
FIG. 19 is an A-A cross-sectional view of FIG. 18.

Hence, according to the present embodiment, for the electrically-conductive lines of the two opposing electrodes, a wiring is provided using the upper surface of the body 103 for one electrode and a wiring is provided using a lower surface of the body 103 for the other electrode. FIG. 19 is an A-A cross-sectional view of FIG. 18. Hereinafter, the wiring structure will be described with reference to FIGS. 18 and 19.

With the example in FIG. 18, the electrode 1041 and the electrode 1043 oppose to each other, and the electrode 1042 and the electrode 1044 oppose to each other. For the electrode 1041, a metal plated wiring portion 1061b is led from a metal plated electrode portion 1061a using the upper surface of the body 103, and a via 1061c is formed downward from the upper surface of the body 103. For the electrode 1043 arranged to oppose to the electrode 1041, a metal plated wiring portion 1063b is led from a metal plated electrode portion 1063a using the lower surface of the body 103, and a via 1063c is formed upward from the lower surface of the body 103.

The via 1061c of the electrode 1041 and the via 1063c of the electrode 1043 are formed close. A contact pin 8041 is screwed at a portion meeting the via 1061c, and a contact pin 8043 is screwed at a portion meeting the via 1063c. A method of connecting the contact pins 8041 and 8043 and the vias 1061c and 1063c is as illustrated in FIG. 12.

Similarly, for the electrode 1044, a metal plated wiring portion 1064b is led from a metal plated electrode portion 1064a using the upper surface of the body 103, and a via 1064c is formed downward from the upper surface of the body 103. For the electrode 1042, a metal plated wiring portion 1062b is led from a metal plated electrode portion 1062a using the lower surface of the body 103, and a via 1062c is formed upward from the lower surface of the body 103.

The via 1064c of the electrode 1044 and the via 1062c of the electrode 1042 are formed close to each other. A contact pin 8044 is screwed at a portion meeting the via 1064c, and a contact pin 8042 is screwed at a portion meeting the via 1062c. A method of connecting the contact pins 8044 and 8042 and the vias 1064c and 1062c is as illustrated in FIG. 12.

By providing the wiring structure in this way, it is possible to form, in a plane, multiple wirings which are required when a plurality of electron beam irradiation detecting systems are formed in one electron column 907, without causing interference between the electrically-conductive lines.

7. Detector

As described above, the electron column 907 has the detector 14 in the electron beam irradiation detecting system. The electron beam is emitted from the electron gun 30, passes the electron beam path and is irradiated on a sample. When the sample is irradiated with the electron beam, for example, secondary electron beams and the like are produced from an irradiated portion. The secondary electrons and the like travel through the electron beam irradiation detecting system in a direction opposite to the direction of the irradiation beam IB due to a drawing electric field. The detector 14 captures and detects the secondary electrons and the like which move back from the sample in this way. Hereinafter, two embodiments will be described as specific configurations of the detector.

7-1. MCP+Anode-Type

Figure 20:
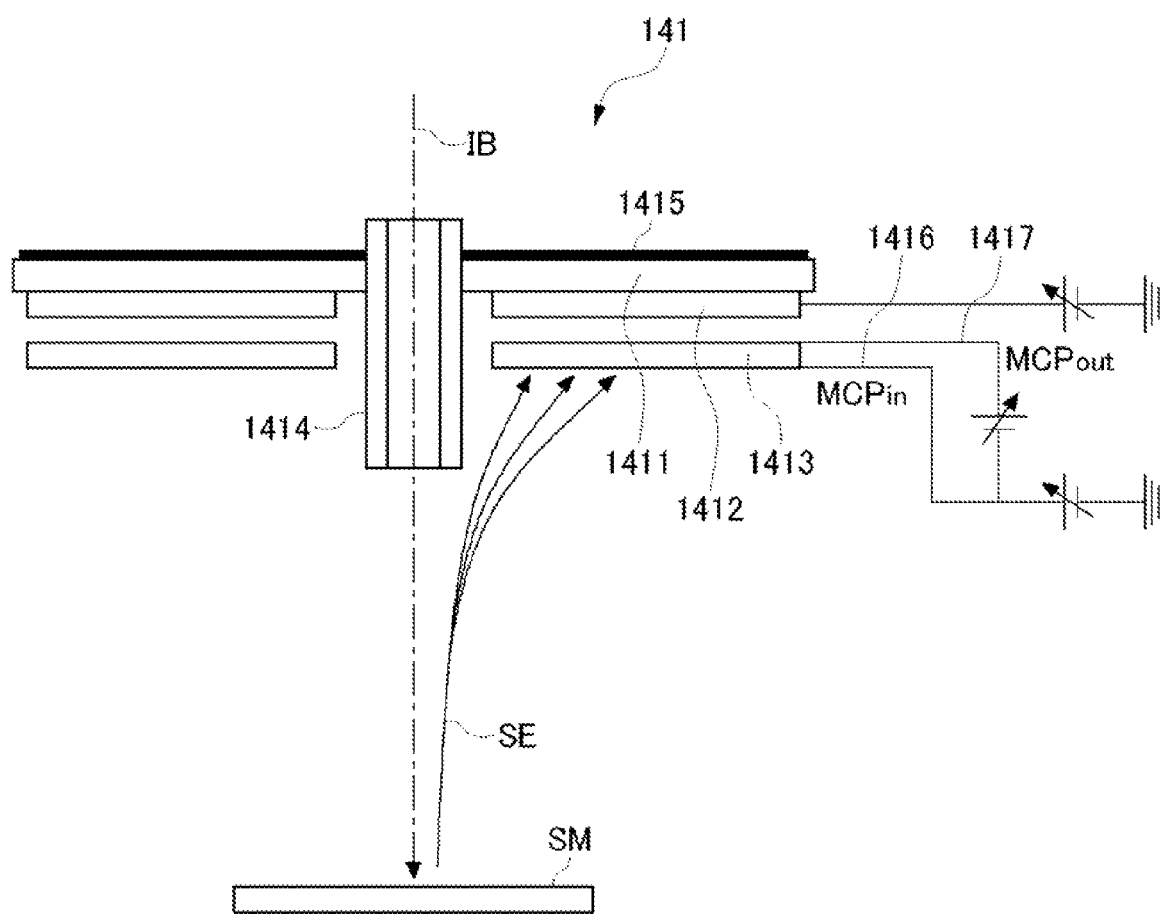
FIG. 20 illustrates a configuration of a MCP+anode-type detector according to the embodiment of the present invention.

FIG. 20 illustrates a configuration of a MCP+anode-type detector according to the present embodiment. A detector (MCP+anode-type) 141 has a tube 1414 to surround the center of the irradiation beam IB from the electron gun 30. The tube 1414 maintains a reference potential (generally a GND potential). The detector 141 further has an insulating ceramic 1411, an anode 1412 and a microchannel plate (MCP) 1413 which serves as an electronic amplifier.

The ceramic 1411 serves as a support body to support the tube 1414, the anode 1412 and the MCP 1413. A support hole is provided in the center of the ceramic 1411, and this support hole supports the outer periphery surface of the tube 1414. The upper surface of the ceramic 1411 is coated with an electrically-conductive film 1415 such that the ceramic 1411 is not charged. In addition, an electrically-conductive material part may be disposed instead of the coating using the electrically-conductive film 1415, or processing of decreasing the resistance in a surface layer of the ceramic 1411 may be applied to the ceramic 1411.

Holes which allow the tube 1414 to pass are provided to the anode 1412 and the MCP 1413. The anode 1412 and the MCP 1413 surround the periphery of the tube 1414 without contacting the tube 1414. The MCP 1413 is provided on a lower side of the anode 1412, and the anode 1412 is provided on a lower side of the ceramic 1411. The MCP 1413 and the anode 1412 are both supported by the ceramic 1411 which serves as a support body.

The irradiation beam IB passes through the tube 1414, and passes through, for example, the objective lens and the deflector and is irradiated on a sample SM. The secondary electrons and the like SE emitted from the sample by the irradiation beam IB pass near the center of the electron beam and are drawn in an upstream direction by the drawing electric field, and, when coming near the MCP 1413, go astray from the center and are incident on the MCP 1413. This trajectory is curved toward the outside before the MCP 1413 as illustrated in FIG. 20. To easily form such a trajectory, that is, to increase the amount of secondary electrons and the like SE drawn to the MCP 1413, a positive voltage is applied to an input plane of the MCP 1413. By, for example, applying the voltage of about 0 to 500 V to the input plane of the MCP 1413, it is possible to increase the drawing amount.

The MCP 1413 has an MCP input terminal (MCPin) 1416 and an MCP output terminal (MCPout) 1417 for the secondary electrons and the like SE. The MCP output terminal 1417 is generally applied a high positive voltage of about 300 to 2000 V. By this means, electrons incident on the MCP input terminal 1416 are repeatedly amplified in a fine-bore tube of the MCP 1413, are emitted from the MCP output terminal 1417 and are absorbed by the anode 1412. In this case, the anode 1412 is generally applied a voltage which is 300 to 3000 V higher than the MCP output terminal 1417. Then, the electrons the amount of which is amplified and which are emitted from the MCP output terminal 1417 are drawn in the direction of the anode 1412, and collide against and are absorbed by the anode 1412.

By directly measuring a current value of the anode 1412 or converting the current value of the anode 1412 into a voltage and measuring the voltage, it is possible to measure the amount of secondary electrons and the like SE emitted from the sample. Further, when the amount of the secondary electrons and the like SE from the sample is acquired while the irradiation beam IB is scanned by, for example, the deflector, and the intensity of the amount of electrons is shown two-dimensionally by partitioning the time, a secondary electron image can be obtained as an inspection image. In this case, a time partition and a site match.

According to a conventional technique, it is difficult to make parts smaller due to the size and the withstand voltages of parts and, even if the parts are made smaller, the rate to capture the secondary electrons and the like is low. According to the present embodiment, it is possible to make a multiple SEM smaller in which a plurality of electron beam irradiation detecting systems are provided in one cylindrical body using electrostatic lenses. Further, the following configuration is employed as a device for preventing a decrease in the capturing rate. That is, when, for example, a scanning width in a sample surface is 1 to 200 μm, the detector 14 is disposed at a distance which is spaced a two hundredfold or more scanning width apart from the sample surface. When the distance from the sample surface to the detector 14 is too close, it is difficult to increase the efficiency of capturing at an outer periphery portion of the detector 14 the secondary electrons and the like from the sample surface. The above configuration has been employed with the present embodiment, so that it is possible to achieve the capturing rate of 40 to 80%.

Thus, according to the present embodiment, a multiple SEM in which a plurality of electron beam irradiation detecting systems are provided in one cylindrical body can be made smaller and provide a high capturing efficiency, and, consequently, realize a data rate of 200 to 2000 MPPS.

7-2. Scintillator+Light Guide+PMT-Type

Figure 21:
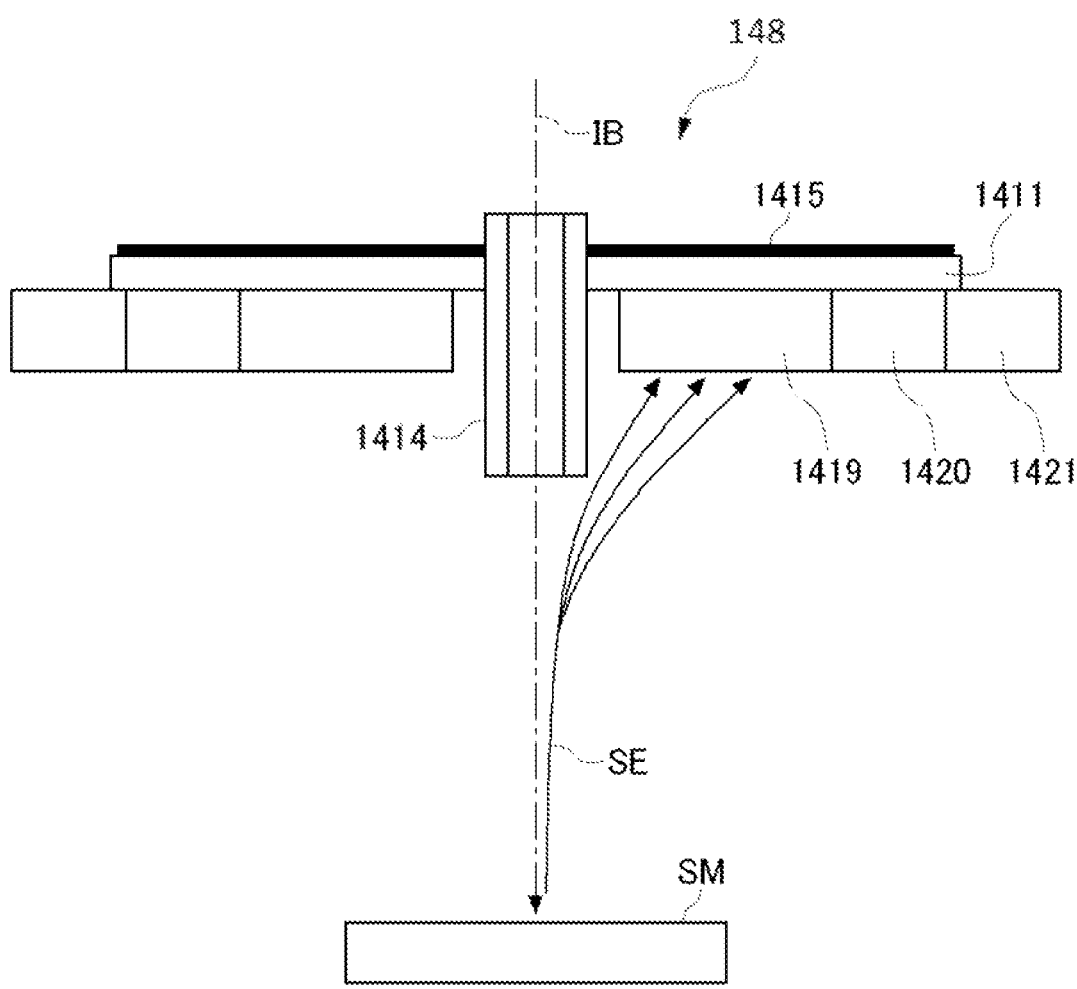
FIG. 21 illustrates a configuration of a scintillator+light guide+PMT-type detector according to the embodiment of the present invention.

FIG. 21 is a view illustrating a configuration of a scintillator+light guide+PMT-type detector according to the present embodiment. A detector 148 has the tube 1414 to surround the center of the irradiation beam IB from the electron gun 30. The tube 1414 maintains a reference potential (generally a GND potential). The detector 148 has the insulating ceramic 1411, a scintillator 1419, a light guide 1420 and a photomultiplier tube (PMT) 1421 which serves as a photoelectric multiplier tube.

A support hole is provided in a center of the ceramic 1411, and this support hole supports an outer periphery surface of the tube 1414. The upper surface of the ceramic 1411 is coated with an electrically-conductive film 1415 such that the ceramic 1411 is not charged. In addition, an electrically-conductive material part may be disposed instead of the coating using the electrically-conductive film 1415, or processing of decreasing the resistance in a surface layer of the ceramic 1411 may be applied to the ceramic 1411.

The scintillator 1419, the light guide 1420 and the PMT 1421 are provided in the same plane. Based on the irradiation beam IB, the scintillator 1419 is provided on the innermost side, the light guide 1420 is provided outside the scintillator 1419 and the PMT 1421 is provided outside the light guide 1420. The scintillator 1419 has a stick shape, and the eight scintillators 1419 are provided around the tube 1414. The scintillators 1419 are arranged orienting in the radial direction of the circle around the irradiation beam IB in the longitudinal direction.

The irradiation beam IB passes through the tube 1414, and passes through, for example, the objective lens and the deflector and is irradiated on a sample SM. The secondary electrons and the like SE emitted from the sample SM by the irradiation beam IB pass near the center of the electron beam path and are drawn in the upstream direction by the drawing electric field, and, when coming near the scintillators 1419, go astray from the center and are incident on the scintillators 1419. This trajectory is curved toward the outside before the scintillators 1419 as illustrated in FIG. 21. To easily form such a trajectory, that is, to increase the amount of secondary electrons and the like SE drawn to the scintillators 1419, a positive voltage is applied to an input plane of the scintillators 1419. By, for example, applying the voltage of about 0 to 500 V to the input plane of the scintillators 1419, it is possible to increase the drawing amount.

The scintillator 1419 converts the incident electron into light having the intensity corresponding to the amount of electrons. The scintillator 1419 can apply the positive voltage, and the surface (upper surface or bottom surface) of the scintillator 1419 is coated with a transparent electrically-conductive film which serves as an electrode to prevent the transmittance from decreasing when the electron is converted into light. Thus, the electron incident on the scintillator 1419 is converted into light, and this light is incident on the light guide 1420. The light transmits through the light guide 1420, and is incident on the PMT 1421. The PMT 1421 converts the incident light into an electron, amplifies the electron and outputs the electron as an electronic signal.

This electronic signal corresponds to the intensity of light incident on the PMT 1421.

In addition, the number of scintillators 1419 is not limited to eight, and may be two, four, twelve, sixteen or other numerical values. Further, the number of scintillators 1419 may be one instead of being plural. By using a plurality of scintillators 1419, it is possible to increase the amount of secondary electrons and the like which can be captured. Further, by using a plurality of scintillators 1419, it is possible to measure a distribution of capturing rates per site of the detector 14, and detect whether the secondary electrons and the like can be evenly captured or positions to capture the secondary electrons and the like concentrate.

Furthermore, when the positions to capture the secondary electrons and the like concentrate, it is possible to correct the positions immediately. When the capturing positions concentrate, progress of a damage varies depending on a site, and, therefore, the amount of current (brightness) becomes different when the positions change. In such a case, calibration needs to be performed when necessary, and therefore the device has a more loss time. When secondary electrons and the like can be evenly captured, an operation is possible in a state where the brightness does not fluctuate immediately even upon state fluctuation, so that it is possible to return a state to a normal state by immediately detecting and correcting concentration of the capturing positions.

Further, a tilted mirror may be built in a scintillator. In this case, an electron is converted into light in the surface of the scintillator, and this light is reflected by the mirror toward the PMT 1421, so that light is efficiently transmitted to the PMT 1421. Further, the surface of the tilted mirror may be coated with an electron/light converting film. In this case, electron/light conversion is performed in the mirror surface, so that light is reflected in a direction of the PMT immediately after conversion, and can be efficiently transmitted to the PMT.

8. Bulb Mechanism

As described above, the electron gun housing 60 is vacuumed by the vacuum pump 40. The electron beam detecting device 100 requires maintenance on a regular basis, and therefore adopts a bulb structure to maintain the vacuum state of the electron gun housing 60 upon maintenance. That is, by sealing the space of the electron gun housing 60 using the bulbs, it is also possible to keep the vacuum state of the electron gun housing 60 upon maintenance.

Figure 22:
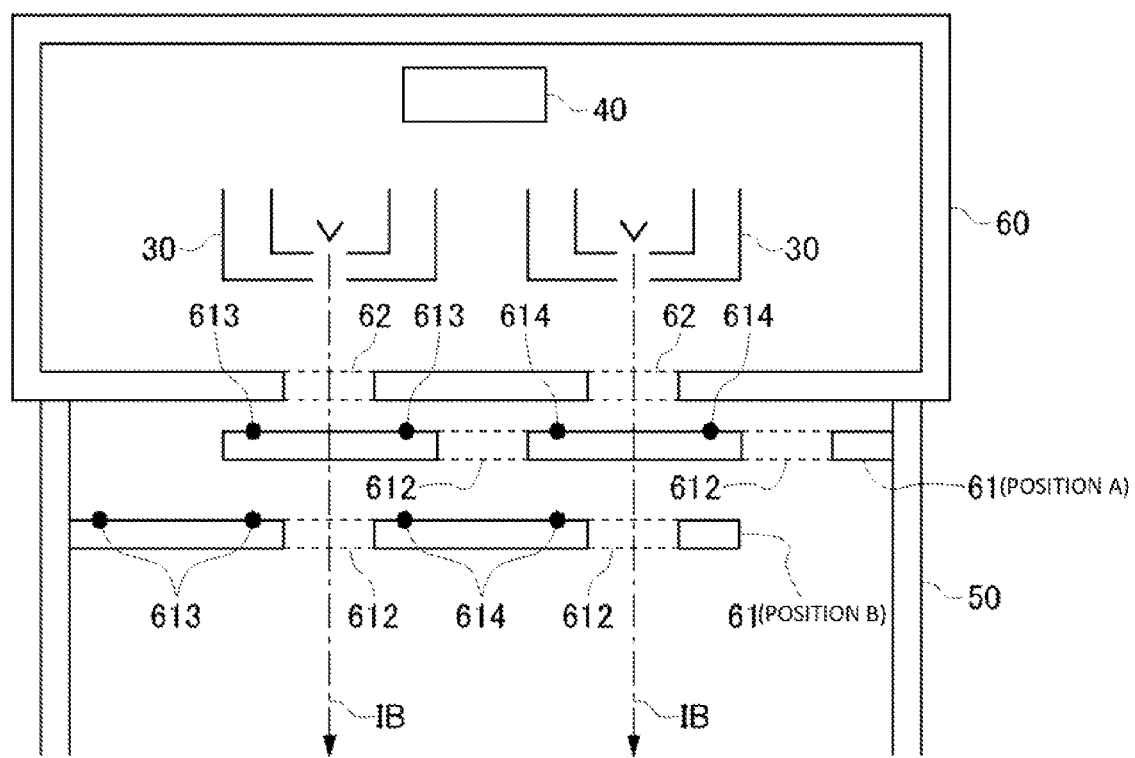
FIG. 22 illustrates a bulb structure according to the embodiment of the present invention.

FIG. 22 is a view illustrating a bulb structure according to the present embodiment. As described above, the electron gun housing 60 includes the electron guns 30 and 30, and is vacuumed by the vacuum pump 40. Although the electron column 907 including this electron gun housing 60 is exposed to atmosphere upon maintenance, the electron gun housing 60 is sealed by closing bulbs 61 in this case.

The electron gun housing 60 has housing holes 62 at positions at which the irradiation beams IB are allowed to pass. The bulbs 61 are provided below the electron gun housing 60. The bulb 61 has bulb holes 612 at positions meeting the electron gun housing 60. Further, O rings 613 and 614 are provided in a plane (upper surface) of the bulb 61 opposing to the electron gun housing 60.

Upon use of the electron beam inspection device 1000, the bulb 61 is placed at a position B. At the position B, the bulb holes 612 of the bulb 61 and the housing holes 62 of the electron gun housing 60 meet. At a position A, the O rings 613 and 614 surround the housing holes 62 of the electron gun housing 60. When the electron gun housing 60 is closed upon maintenance, the bulb 61 moves from the position B to the position A, and further moves upward from the position A, so that the O rings 613 and 614 close the housing holes 62 of the electron gun housing 60 and seals the electron gun housing 60. In addition, movement of the bulbs 61 from the position B to the position A and movement from the position A to the position B may adopt an arbitrary combination of movement in the horizontal direction and movement in a vertical direction, or diagonal movement.

Thus, according to the present embodiment, the bulb holes 612 which allow the irradiation beams IB to pass and the O rings 613 and 614 which seal the electron gun housing 60 are formed in the bulbs 61, and the bulbs 61 are misaligned in the horizontal direction to have the housing holes 62 of the bulbs 61 and the housing holes 62 of the electron gun housing 60 match or have the O rings 613 and 614 surround the housing holes 62 of the electron gun housing 60, so that it is possible to allow the irradiation beams IB from the electron gun housing 60 to pass and seal the electron gun housing 60 by a simple operation.

Figure 23:
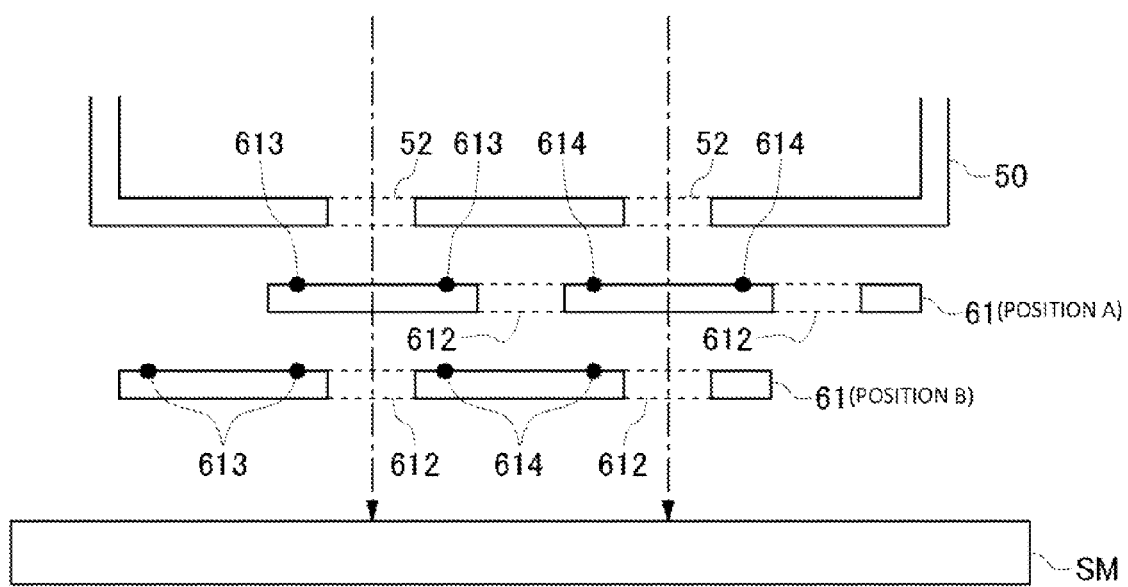
FIG. 23 illustrates another example of a bulb mechanism according to the embodiment of the present invention.

FIG. 23 is a view illustrating another example of a bulb mechanism according to the present embodiment. The above-described bulb mechanism may be provided at a lower end portion of the cylindrical body 50 as illustrated in FIG. 23. At the lower end portion of the cylindrical body 50, cylindrical body holes 52 are provided at positions at which the irradiation beams IB are allowed to pass. Upon use of the electron beam inspection device 1000, the bulb 61 is placed at the position B. At the position B, the cylindrical body holes 52 of the cylindrical body 50 and the bulb holes 612 of the bulbs 61 meet. At the position A, the O rings 613 and 614 surround the cylindrical body holes 52 of the cylindrical body 50.

When the electron gun housing 60 and the cylindrical body 50 are closed upon maintenance, the bulb 61 moves from the position B to the position A, and further moves upward from the position A, so that the O rings 613 and 614 close the cylindrical body holes 52 of the cylindrical body 50 and seal space formed by the electron gun housing 60 and the cylindrical body 51. In addition, movement of the bulbs 61 from the position B to the position A and movement from the position A to the position B may adopt an arbitrary combination of movement in the horizontal direction and movement in a vertical direction, or diagonal movement.

Also, according to the present embodiment, the bulb holes 612 which allow the irradiation beams IB to pass and the O rings 613 and 614 which seal the space formed by the electron gun housing 60 and the cylindrical body 50 are formed in the bulbs 61, and the bulbs 61 are misaligned in the horizontal direction to have the bulb holes 612 of the bulbs 61 and the cylindrical body holes 52 of the cylindrical body 50 match or have the O rings 613 and 614 surround the cylindrical body holes 52 of the cylindrical body 50, so that it is possible to allow the irradiation beams IB from the electron gun housing 60 to pass and seal the space formed by the electron gun housing 60 and the cylindrical body 50 by a simple operation.

9. Deflector

Figure 24:
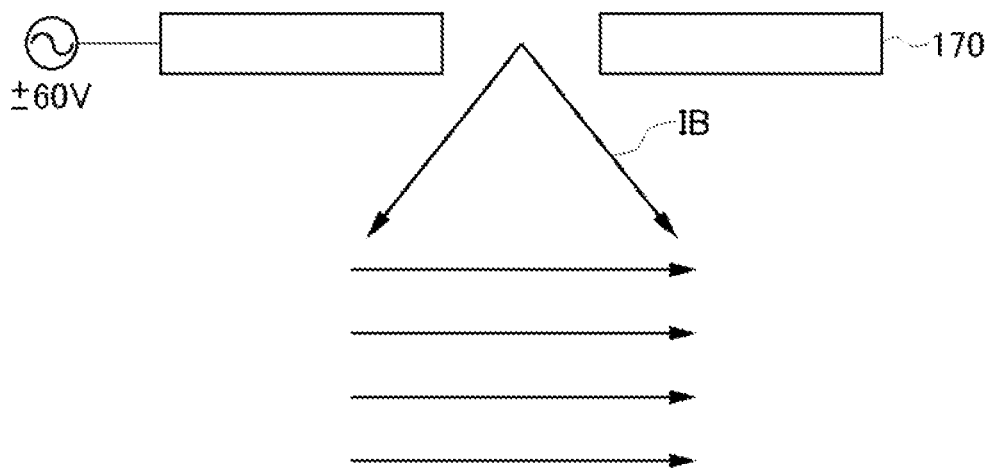
FIG. 24 illustrates a configuration of a conventional deflector.

The deflector deflects the irradiation beam IB irradiated from the electron gun 30 to perform scanning. FIG. 24 illustrates a configuration of a conventional deflector. A deflector 170 is formed with an electrode made of a single board, and a hole is formed in the electron beam path. The irradiation beam IB passing through the hole of the deflector 170 is deflected at an angle matching the magnitude of the voltage is changed. The deflector 170 is applied an alternate current voltage of ±60 V. By applying the alternate current voltage to the deflector 170, the irradiation beam IB is deflected according to the voltage amplitude, and scans a sample. According to a conventional configuration, increasing the frequency of the alternate current voltage of ±60 V to be applied to the deflector 170 is limited, and therefore a scanning frequency of the irradiation beam IB is also limited.

Figure 25:
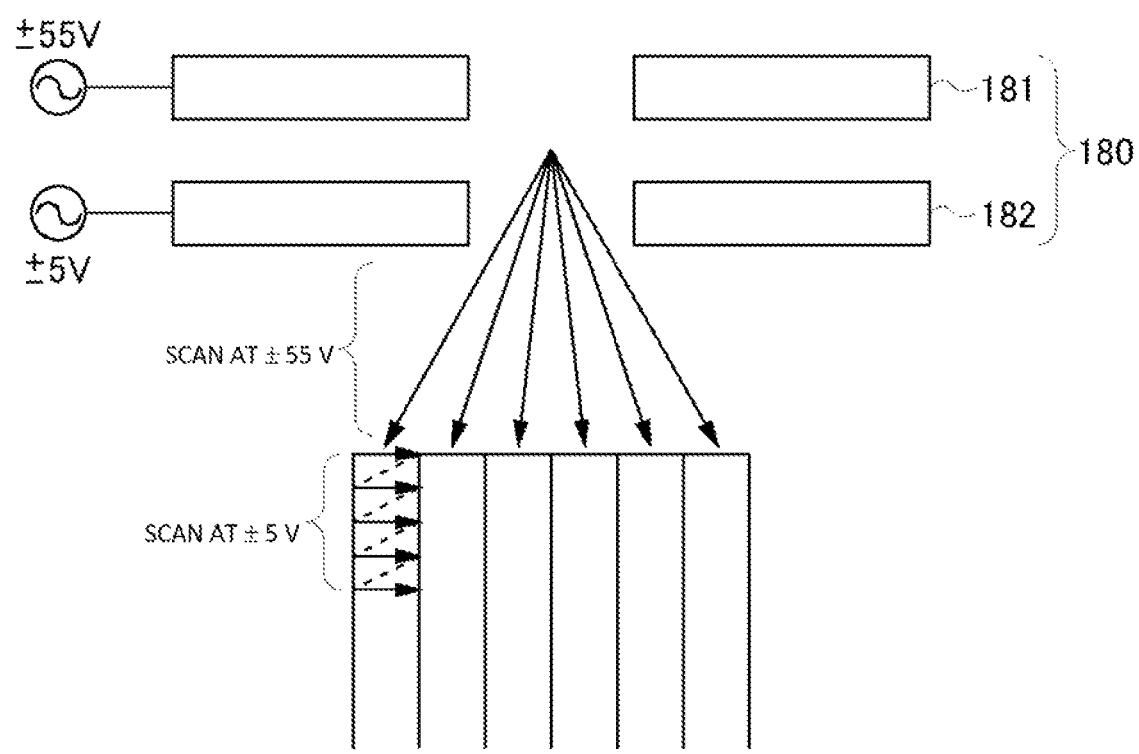
FIG. 25 illustrates a configuration of a deflector according to the embodiment of the present invention.

FIG. 25 is a view illustrating a configuration of a deflector according to the present embodiment. A deflector 180 according to the present embodiment is formed with electrodes 181 and 182 of two boards. In both of the electrodes 181 and 182, holes are formed in the electron beam path. The irradiation beam IB passing through this hole is deflected at an angle matching the voltage applied to each of the voltages 181 and 182. According to the present embodiment, an alternate current voltage of ±55 V is applied to the upper electrode 181, and an alternate current voltage of ±5 V is applied to the lower electrode 182.

The deflector 180 employs the above configuration to perform macro scanning using the alternate current voltage to be applied to the upper electrode 181, and perform micro scanning using the alternate current voltage to be applied to the lower electrode 182. The frequency of the alternate current voltage to be applied to the upper electrode 181 to perform macro scanning is higher than the frequency of the alternate current voltage to be applied to the lower electrode 182 to perform micro scanning. By amplifying the voltage to be applied to the lower electrode 182 for the irradiation beam IB deflected by the upper electron 181 in the reference direction, the irradiation beam IB is further deflected in a small range based on the reference direction and scans a sample (micro scanning). When main scanning and sub scanning are performed in this range, the voltage to be applied to the upper electrode 181 changes, and the irradiation beam is deflected in the reference direction (macro scanning).

Further, by amplifying the voltage to be applied to the lower electrode 182 based on a new reference direction, the irradiation beam IB is further deflected in a small range based on the reference direction and scans a sample (micro scanning). Thus, when scanning a deflectable range is finished by macro scanning by repeating macro scanning and micro scanning, the stage moves, and the next new area is micro-scanned and macro-scanned in the same fashion.

According to micro scanning, the irradiation beam IB is deflected at a low voltage of ±5 V, so that it is possible to use a power supply of a high frequency and, consequently, increase a scanning speed and reduce a time to inspect a sample.

In addition, although only one deflector 180 has been described above, a plurality of electron beam irradiation detecting systems are provided in one cylindrical body in the electron column 907 according to the present embodiment as described above, and a plurality of the above-described deflectors 180 are provided in the horizontal direction. In this case, power supplies may be provided in a plurality of upper electrodes 181 and a plurality of lower electrodes 182, and a common power supply may be used for a plurality of upper electrodes 181. In this case, an offset alternate current voltage of −4.5 V to 5.5 V is applied to the lower electrodes 182. Thus, a plurality of deflectors provided in parallel share a power supply, so that it is possible to contribute to not only reducing cost but also making the electron column 907 smaller.

A method of inspecting a sample using the above electron beam inspection device 1000 will be described. Hereinafter, a method of inspecting a sample formed by aligning dies of a square semiconductor integrated circuit in a matrix and repeating the identical pattern will be described. With the inspecting method according to the present embodiment, die-die comparison is performed by comparing identical patterns of a plurality of dies and detecting a difference as a defect.

10. Calibration

As described above, the electron beam inspection device 1000 according to the present embodiment has a plurality of (eight) electron beam irradiation detecting systems in the electron column 907. Upon an inspection, an inspection is performed by means of a plurality of electron beams by simultaneously using a plurality of these electron irradiation detecting systems, and inspection results are synthesized to generate an inspection image. In this case, when magnifying powers of a plurality of electron beam irradiation detecting systems and irradiation positions of electron beams are not uniform, even if inspection results obtained by a plurality of electron beam irradiation detecting systems are synthesized, it is not possible to obtain an accurately synthesized inspection image. Hence, characteristics (calibration information) of the magnifying powers of the electron beam irradiation detecting systems and irradiation positions of electron beams are acquired in advance and stored, and inspection results obtained by the electron beam irradiation detecting systems are calibrated according to these characteristics.

Upon this calibration, first, while a stage is moved in a state where the electron beam is linearly irradiated from each electron gun (the electron beam in this case is referred to as a "reference beam") without activating the deflector of each electron beam irradiating detecting system, a test mark printed on a surface of a test sample is detected in order in each electron beam irradiation detecting system to find for each electron beam irradiation detecting system the magnifying power and the moving distance of the stage (that is, irradiation position coordinates of the reference beam) when the test mark is detected.

FIG. 26 is a view illustrating a positional relationship of a reference beam RB of each electron beam irradiation detecting system. According to the present embodiment, as illustrated in FIG. 26, first to eight reference beams RB1 to RB8 are irradiated from eight first to eighth electron beam irradiation detecting systems aligned in two columns.

TABLE 1

| Reference beam | Magnifying power | Coordinates X (μm) | Y |
|---|---|---|---|
| RB1 | 1.000 | 0.00 | 0.00 |
| RB2 | 1.010 | 1.24 | −20001.36 |
| RB3 | 1.009 | −2.36 | −40006.15 |
| RB4 | 0.998 | −1.47 | −60010.98 |
| RB5 | 0.996 | 20002.23 | −2.45 |
| RB6 | 1.011 | 20005.01 | −20007.56 |
| RB7 | 0.999 | 19999.02 | −40009.25 |
| RB8 | 0.996 | 20002.45 | −60007.16 |

TABLE 2

| Reference beam | Magnifying power | Coordinates X (μm) | Y |
|---|---|---|---|
| RB1 | 1.000 | 0.00 | 0.00 |
| RB2 | 1.013 | 1.23 | −20001.12 |
| RB3 | 1.008 | −2.38 | −40006.36 |
| RB4 | 0.997 | −1.49 | −60010.78 |
| RB5 | 0.995 | 20002.32 | −2.66 |
| RB6 | 1.013 | 20005.10 | −20007.21 |
| RB7 | 0.997 | 19999.09 | −40009.58 |
| RB8 | 0.994 | 20002.82 | −60007.85 |

Table 1 and Table 2 are tables indicating an example of results of acquiring magnifying power ratios and coordinate positions (calibration information) of other electron beam irradiation detecting systems when a first electron beam irradiation detecting system is a reference electron beam irradiation detecting system and a test mark of a test sample is observed at one hundredfold (table 1) and one thousandfold (table 2) magnifying powers. Ideally, the ratios of the magnifying powers of the other electron beam irradiation detecting systems with respect to the magnifying power of the first electron beam irradiation detecting system which serves as a reference are all 1.000 (the same magnifying power as the first electron beam irradiation detecting system), and the coordinates of each electron beam irradiation detecting system are determined according to the distance illustrated in FIG. 26.

However, in reality, the magnifying powers are not as ideally assumed due to an error, and a detection result needs to be calibrated using calibration information to secure continuity of the result detected by each electron beam irradiation detecting system. These pieces of calibration information are acquired in advance and stored in an image processing device 160, and, when inspection images are synthesized based on an inspection result from each electron beam irradiation detecting system, the inspection result from each electron beam irradiation detecting system is calibrated based on these pieces of calibration information.

According to the above configuration, when a sample is inspected by simultaneously using a plurality of electron beam irradiation detecting systems, it is possible to correct slight misalignment from the original position of each electron beam irradiation detecting system, and acquire an accurately synthesized inspection image.

11. Creation of Focus Map

When a sample is inspected, a sample is set on the stage 910. The sample set on the stage 910 and the electron column 907 having a plurality of electron beam irradiation detecting systems are ideally vertical. However, the surface of the sample and the electron column 907 are not accurately vertical due to the tilt of the stage 910, the tilt of the sample and/or the tilt of the electron column 907. When the sample is scanned by the electron column 907 in this case, the distance between the electron column 907 and the surface of the sample changes depending on a site of the sample, each electron beam irradiation detecting system cannot adjust focus. Hence, the electron beam inspection device 1000 according to the present embodiment generates a focus map by setting an inspection target sample on the stage, then adjusting the focus on a plurality of points on the sample surface and acquiring focus adjustment values.

Figure 27:
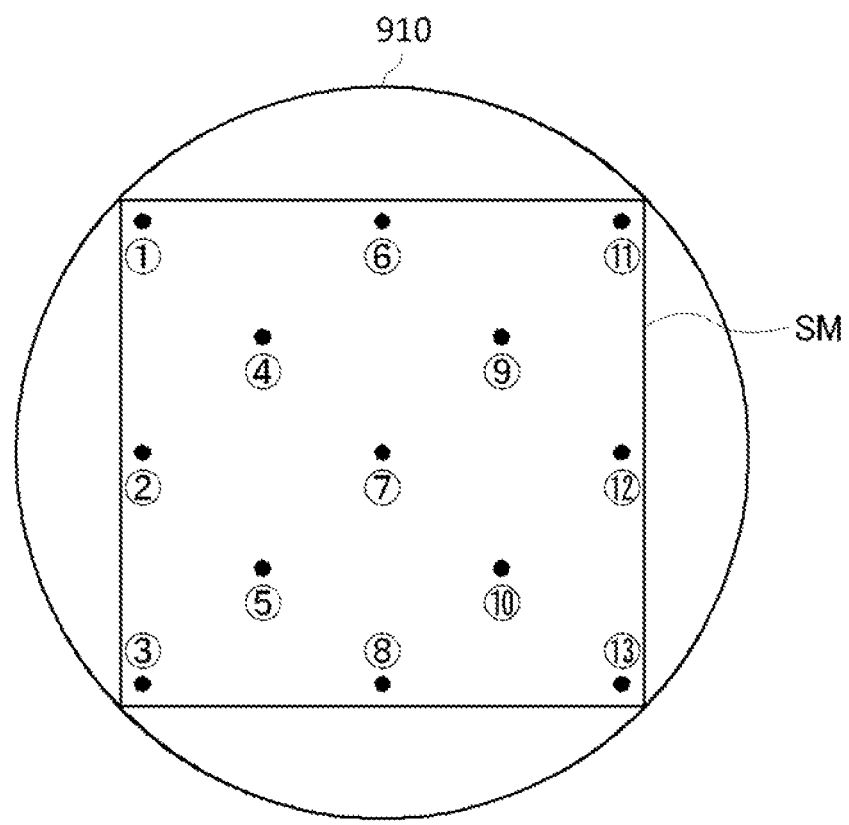
FIG. 27 illustrates an example of measurement points of a sample for creating a focus map according to the embodiment of the present invention.

FIG. 27 is a view illustrating an example of measurement points on a sample for creating a focus map according to the present embodiment. The focus is adjusted for these measurement points 1 to 13, and focus adjustment values of adjusted focus (or height information of the sample surface) are stored. Focus adjustment values of portions other than the measurement points are found by interpolating the focus adjustment values of the measurement points nearby. Upon an inspection, the focus is automatically adjusted according to the stored focus map.

Thus, by acquiring focus adjustment values of a plurality of measurement points on the sample set on the stage and creating a focus map, it is possible to adequately adjust the focus according to the position on the sample upon an inspection.

12. Die-Die Comparison

As described above, the electron beam inspection device 1000 according to the present embodiment inspects dies by die-die comparison. Dies having an identical rectangular pattern are repeatedly formed on a sample, so that, when each electron beam irradiation detecting system inspects a different die, it is possible to perform die-die comparison for detecting a portion having a difference as a defect.

According to the present embodiment, a plurality of electron beam irradiation detecting systems each inspect dies of interest and compare inspection results of the electron beam irradiation detecting systems to perform die-die comparison. However, a repetition pitch (a pitch of dies) of the pattern on the sample and an alignment pitch of electron beam irradiation detecting systems (that is, a distance between adjacent electron beam irradiation detecting systems) do not necessarily match. The pitch of the electron beam irradiation detecting systems is larger than a pitch of a pattern of an inspection target in some cases and is smaller in some cases.

Figure 28:
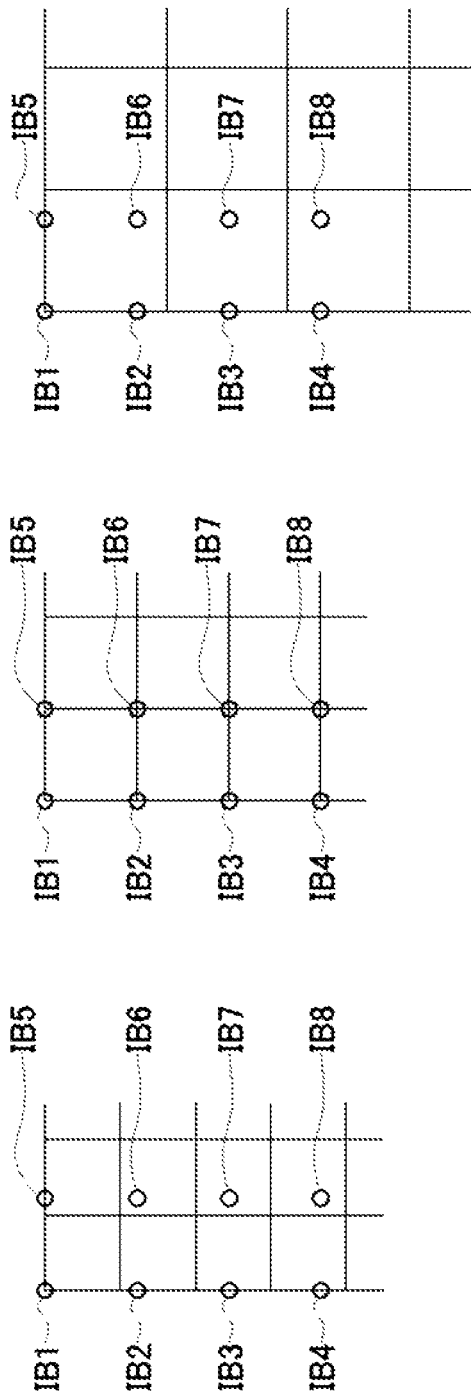
FIG. 28A illustrates a relationship between a pitch of the electron beam irradiation detecting systems and a pitch of dies (in case that the pitch of the electron beam irradiation detecting systems is larger than the pitch of the dies) according to the embodiment of the present invention.
FIG. 28B illustrates a relationship between a pitch of electron beam irradiation detecting systems and a pitch of the dies (in case that the pitch of the electron beam irradiation detecting systems is equal to the pitch of the dies) according to the embodiment of the present invention.
FIG. 28C illustrates a relationship between a pitch of the electron beam irradiation detecting systems and a pitch of dies (in case that the pitch of the electron beam irradiation detecting systems is smaller than the pitch of the dies) according to the embodiment of the present invention.

FIGS. 28A to 28C are views illustrating relationships between pitches of irradiation beams IB1 to 8 (that is, pitches of the electron beam irradiation detecting systems) and pitches of dies, and FIG. 28A is the view illustrating the relationship between the irradiation beams IB1 to 8 and the dies in case that the pitch of the electron beam irradiation detecting system is larger than the pitch of dies, FIG. 28B is the view illustrating the relationship between the irradiation beams IB1 to 8 and the dies in case that the pitch of the electron beam irradiation detecting systems and the pitch of the dies are equal and FIG. 28C is the view illustrating the relationship between the irradiation beams IB1 to 8 and the dies in case that the pitch of the electron beam irradiation detecting system is smaller than the pitch of the dies.

12-1. Die is Smaller Than Deflectable Range of Irradiation Beam

Figure 29:
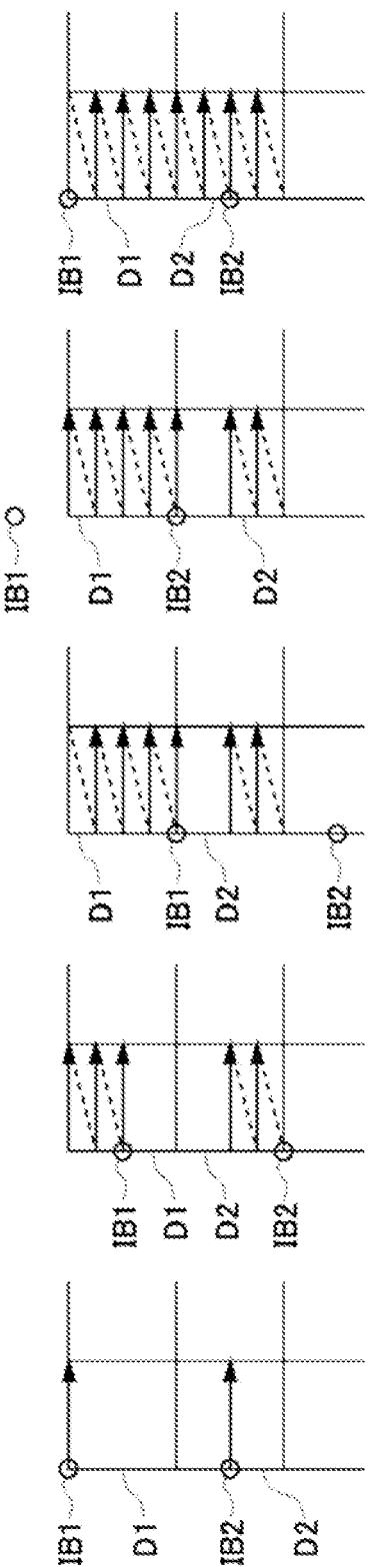
FIG. 29A illustrates process (first step) of scanning dies by means of irradiation beams in case that the pitch of the electron beam irradiation detecting systems is larger than the pitch of the dies according to the embodiment of the present invention.
FIG. 29B illustrates process (second step) of scanning dies by means of irradiation beams in case that the pitch of the electron beam irradiation detecting systems is larger than the pitch of the dies according to the embodiment of the present invention.
FIG. 29C illustrates process (third step) of scanning dies by means of irradiation beams in case that the pitch of the electron beam irradiation detecting systems is larger than the pitch of the dies according to the embodiment of the present invention.
FIG. 29D illustrates process (fourth step) of scanning dies by means of irradiation beams in case that the pitch of the electron beam irradiation detecting systems is larger than the pitch of the dies according to the embodiment of the present invention.
FIG. 29E illustrates process (fifth step) of scanning dies by means of irradiation beams in case that the pitch of the electron beam irradiation detecting systems is larger than the pitch of the dies according to the embodiment of the present invention.

12-1-1. Pitch of Electron Beam Irradiation Detecting Systems is Larger Than Pitch of Dies FIGS. 29A to 29E are views illustrating process of scanning dies D1 and D2 by means of the irradiation beams IB1 and IB2 in case that the pitch of the electron beam irradiation detecting systems is larger than the pitch of dies as illustrated in FIG. 28A. In addition, FIG. 29 illustrates only macro scanning, and process of macro scanning will be described below. In FIG. 29, an irradiation beam performs main scanning from the left to the right and performs sub scanning from the top to the bottom. Further, in FIG. 29, the dies D1 and D2 are scanned by performing main scanning four times. This main scanning is performed by deflecting an irradiation beam.

At a stage in FIG. 29A, the irradiation beam IB1 and the irradiation beam IB2 simultaneously scan the die D1 and the die D2. With an example in FIG. 29, the pitch of the electron beam irradiation detecting systems is larger than the pitch of the dies, and the irradiation beam IB2 starts scanning from a third line of the die D2. When the irradiation beams IB1 and IB2 finish main scanning of two lines, at a stage in FIG. 29B, the irradiation beam IB2 finishes scanning the final line of the die D2. Then, the irradiation beam IB2 subsequently stops scanning, and the irradiation beam IB1 subsequently continues scanning. At a stage in FIG. 29C, the irradiation beam IB1 finishes scanning the die D1.

Subsequently, the stage is moved to position the irradiation beam IB2 on the upper left of the die D2 as illustrated in FIG. 29D, and the irradiation beam IB2 scans upper two lines of the die D2. In this case, the irradiation beam IB1 stops scanning. When the irradiation beam IB2 finishes scanning the upper two lines of the die D2, as illustrated in FIG. 29E, the irradiation beam IB1 finishes scanning the die D1 and the irradiation beam IB2 finishes scanning the die D2.

According to the above scanning process, even when the pitch of the electron beam irradiation detecting systems is larger than the pitch of the dies, it is possible to inspect a sample by die-die comparison by comparing an inspection result of the die D1 of the first electron beam irradiation detecting system and an inspection result of the die D2 of the second electron beam irradiation detecting system.

Figure 30:
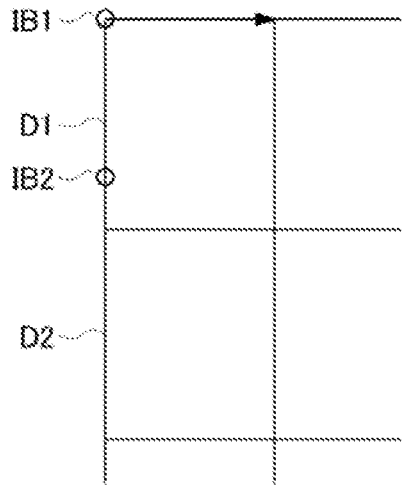
FIG. 30A illustrates process (first step) of scanning dies by means of irradiation beams in case that the pitch of the electron beam irradiation detecting systems is smaller than the pitch of the dies according to the embodiment of the present invention.
FIG. 30B illustrates process (second step) of scanning dies by means of irradiation beams in case that the pitch of the electron beam irradiation detecting systems is smaller than the pitch of the dies according to the embodiment of the present invention.
FIG. 30C illustrates process (third step) of scanning dies by means of irradiation beams in case that the pitch of the electron beam irradiation detecting systems is smaller than the pitch of the dies according to the embodiment of the present invention.
FIG. 30D illustrates process (fourth step) of scanning dies by means of irradiation beams in case that the pitch of the electron beam irradiation detecting systems is smaller than the pitch of the dies according to the embodiment of the present invention.
Figure 30:
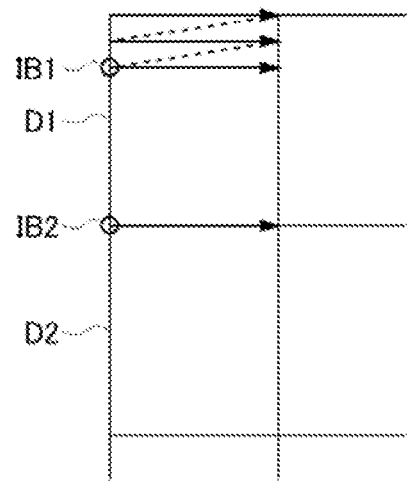
Figure 30:
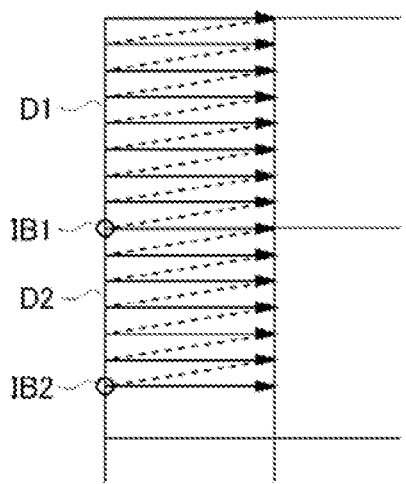
Figure 30:
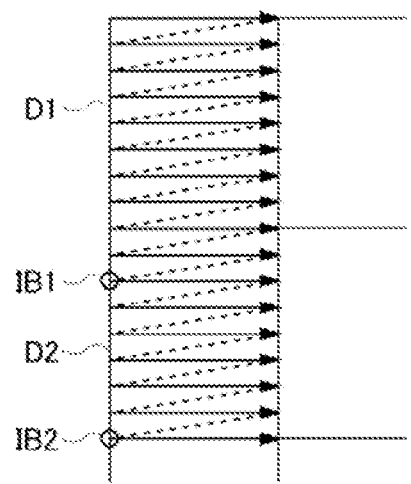

12-1-2. Pitch of Electron Beam Irradiation Detecting Systems is Smaller Than Pitch of Dies FIGS. 30A to 30D are views illustrating process of scanning dies D1 and D2 by means of the irradiation beams IB1 and IB2 in case that the pitch of the electron beam irradiation detecting systems is larger than the pitch of dies as illustrated in FIG. 28C. FIG. 30 also illustrates only macro scanning. In FIG. 30, the dies D1 and D2 are scanned by performing main scanning eight times.

At a stage in FIG. 30A, the irradiation beam IB2 cannot scan the die D2, and therefore, only the irradiation beam IB1 scans the dies D1 and an operation using the irradiation beam IB2 is stopped. At the stage in FIG. 30B, the irradiation beam IB2 reaches an upper end of the die D2, and the irradiation beam IB1 scans the die D1 and the irradiation beam IB2 scans the die D2 simultaneously in parallel.

When the irradiation beams IB1 and IB2 finish main scanning of eight lines, at a stage in FIG. 30C, the irradiation beam IB1 finishes scanning the final line of the die D1. Then, the irradiation beam IB1 subsequently stops scanning, and the irradiation beam IB2 also continues scanning subsequently. At a stage in FIG. 30D, the irradiation beam IB2 also finishes scanning the die D2.

According to the above scanning process, even when the pitch of the electron beam irradiation detecting systems is smaller than the pitch of the dies, it is possible to inspect a sample by die-die comparison by comparing an inspection result of the die D1 of the first electron beam irradiation detecting system and an inspection result of the die D2 of the second electron beam irradiation detecting system.

12-2. Die is Larger Than Deflectable Range of Irradiation Beam

According to the above embodiment, the size of one die is smaller than a range of an irradiation beam which can be deflected by a deflector. Hence, when scanning starts from a corner of a die like the die D1 illustrated in FIG. 29, it is possible to finish an operation of this die only by deflecting an irradiation beam without moving the stage. Hereinafter, process of scanning the die D1 and the die D2 by means of the irradiation beams IB1 and IB2 in case that the size of one die is much larger than the deflectable range of the irradiation beam will be described.

Figure 31:
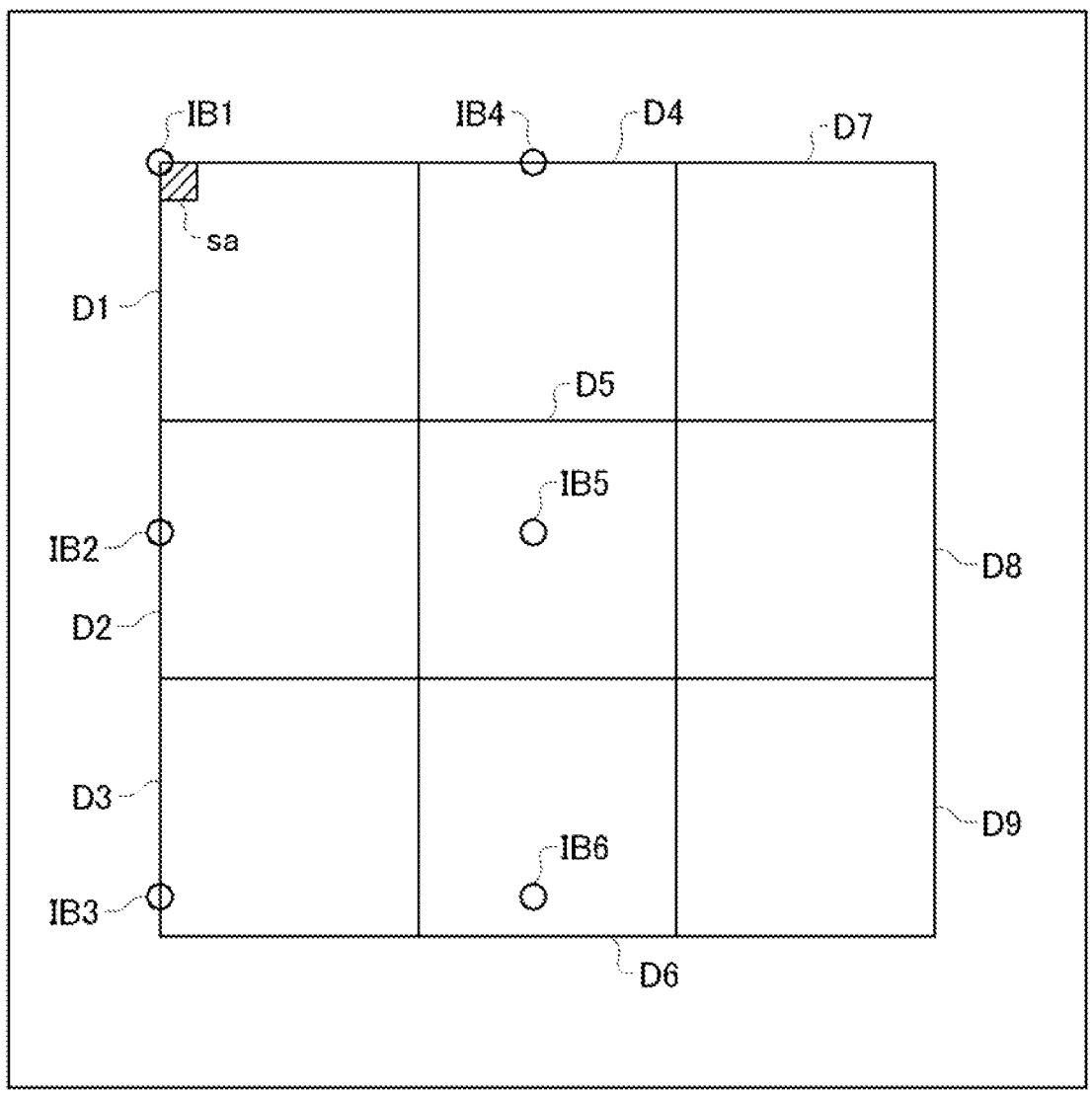
FIG. 31 illustrates a relationship between a sample, an irradiation beam and a deflectable range of the irradiation beam in case that the size of one die is much larger than the deflectable range of the irradiation beam according to the embodiment of the present invention.

FIG. 31 is a view illustrating a relationship between a sample, an irradiation beam and a deflectable range of the irradiation beam in case that the size of one die is much larger than the deflectable range of the irradiation beam. In FIG. 31, a unit scanning range sa indicated by diagonal lines is a range which can be scanned by deflecting the irradiation beam IB1, and the size of a unit scanning range is also the same for other irradiation beams. FIG. 31 illustrates that the pitch of irradiation beams is larger than the pitch of dies. Further, FIG. 31 illustrates the six irradiation beams IB1 to 6 vertically aligned in two rows.

Figure 32:
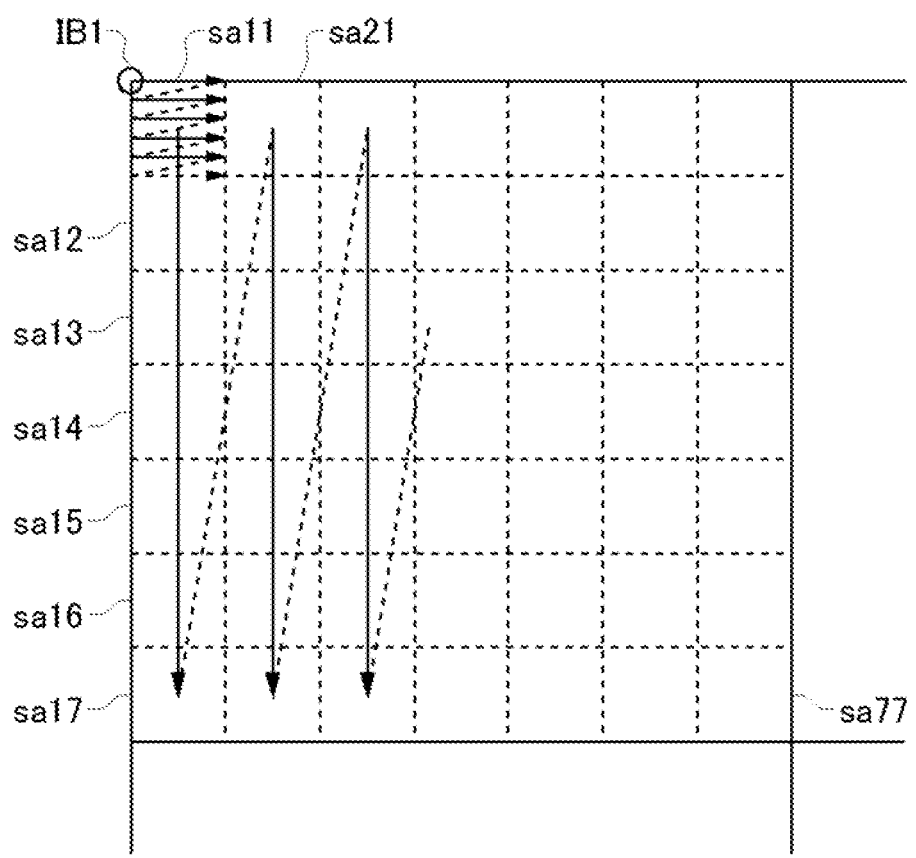
FIG. 32 illustrates process of scanning dies by means of irradiation beams according to the embodiment of the present invention.

In this case, in terms of the relationship between the irradiation beam IB1 and the die D1, the irradiation beam IB1 can scan the die D1 according to the following process. FIG. 32 is a view illustrating process of scanning the die D1 by means of the irradiation beam IB1. In addition, FIG. 32 illustrates only macro scanning of a unit scanning range sa1. In FIG. 32, an irradiation beam performs main scanning from the left to the right and performs sub scanning from the top to the bottom.

Further, with an example in FIG. 32, a length of the die D1 in a vertical direction is a seven fold length of the unit scanning range in the vertical direction, and scanning in the vertical direction is finished by moving the stage seven times in the vertical direction. Furthermore, the length of the die D1 in the vertical direction is a seven fold length of the unit scanning range in the vertical direction, and scanning in the vertical direction is finished by moving the stage seven times in the vertical direction. The length of the die D1 in the vertical direction is a seven fold length of the unit scanning range in the vertical direction, and scanning in the vertical direction is finished by moving the stage seven times in the vertical direction. The length of the die D1 in the horizontal direction is also a seven fold length of the unit scanning range in the horizontal direction, and scanning in the horizontal direction is finished by moving the stage seven times in the horizontal direction. This scanning of each unit scanning range is performed by deflecting an irradiation beam.

The irradiation beam IB1 starts scanning from an upper left of the die D1. First, by deflecting the irradiation beam IB1 in a state where the stage is fixed, a unit scanning range sa11 is scanned. When scanning the unit scanning range sa11 is finished, the stage is moved upward by the height of the unit scanning range such that the irradiation beam IB1 is positioned in a unit scanning range sa12. Further, by fixing the stage at this position and deflecting the irradiation beam IB1, the unit scanning range sa12 is scanned.

When an operation of a unit scanning range sa17, that is, an operation of a lowermost unit scanning range of the die D1 is finished by repeating scanning by deflecting the irradiation beam IB1 and moving the stage by the unit scanning range in this way (referred to as "step & repeat scanning" below), the stage is moved such that the irradiation beam IB1 is positioned in the unit scanning range sa21. When scanning a unit scanning range sa77 is finished by continuing step & repeat scanning, scanning all planes of the die D1 is finished.

Figure 33:
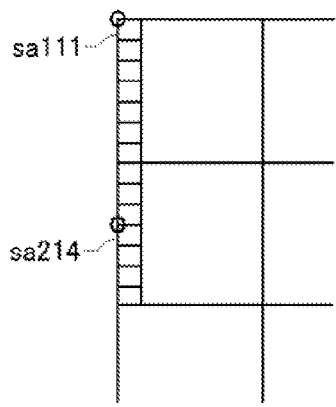
FIG. 33A illustrates process (first step) of scanning dies by means of irradiation beams according to the embodiment of the present invention.
FIG. 33B illustrates process (second step) of scanning dies by means of irradiation beams according to the embodiment of the present invention.
FIG. 33C illustrates process (third step) of scanning dies by means of irradiation beams according to the embodiment of the present invention.
FIG. 33D illustrates process (fourth step) of scanning dies by means of irradiation beams according to the embodiment of the present invention.
FIG. 33E illustrates process (fifth step) of scanning dies by means of irradiation beams according to the embodiment of the present invention.
FIG. 33F illustrates process (sixth step) of scanning dies by means of irradiation beams according to the embodiment of the present invention.
Figure 33:
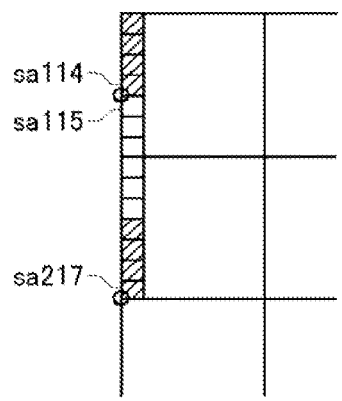
Figure 33:
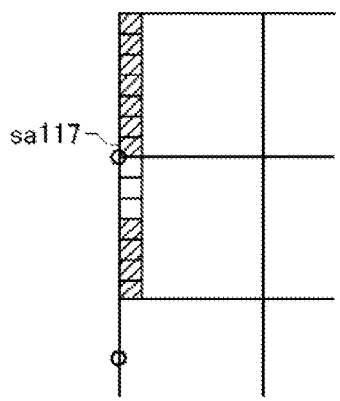
Figure 33:
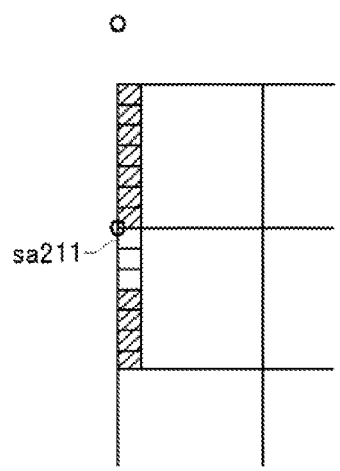
Figure 33:
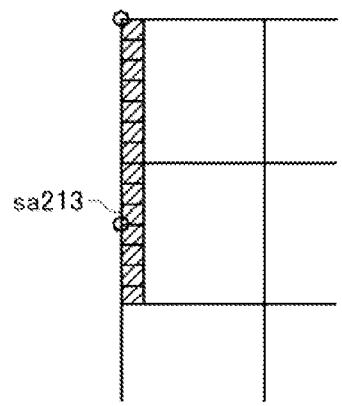
Figure 33:
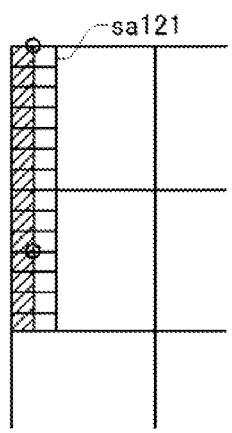

FIGS. 33A to 33F are views illustrating process of scanning dies D1 and D2 by means of the irradiation beams IB1 and IB2 in case that the pitch of the electron beam irradiation detecting systems is larger than the pitch of dies as illustrated in FIG. 33A. In addition, FIG. 33 illustrates unit scanning ranges which are scanned by diagonal lines.

At a stage in FIG. 33A, the irradiation beam IB1 and the irradiation beam IB2 simultaneously start scanning the die D1 and the die D2, respectively. With an example in FIG. 33, although the pitch of the electron beam irradiation detecting systems is larger than the pitch of the dies, and so the irradiation beam IB1 starts scanning from a unit scanning range sa111 at the upper left of the die D1, the irradiation beam IB2 starts scanning from a fourth unit scanning range from the top of the leftmost column of the die D2.

According to step & repeat scanning using the irradiation beams IB1 and IB2, four sets of unit scanning ranges are scanned and the stage is moved and, at a stage in FIG. 33B, the irradiation beam IB2 finishes scanning a unit scanning range sa217 at a lower left of the die D2. Then, the irradiation beam IB2 subsequently stops scanning, and the irradiation beam IB1 subsequently continues step & repeat scanning. At a stage in FIG. 33C, the irradiation beam IB1 finishes scanning a unit scanning range sa117 at a lower left of the die D1.

Next, as illustrated in FIG. 33D, the stage is moved upward such that the irradiation beam IB2 is positioned in the unit scanning range sa211 at the upper left of the die D2. Further, only the irradiation beam IB2 scans three sets of unit scanning ranges and the stage is moved. During this operation, the irradiation beam IB1 stops scanning. When scanning the three sets of unit scanning ranges and moving the stage are finished, and the irradiation beam IB2 finishes an operation of a unit scanning range sa213 of the die D2, scanning left end columns of the die D1 and the die D2 is finished as illustrated in FIG. 33E. At this point of time, it is possible to perform die-die comparison of corresponding positions of the die D1 and the die D2.

Next, as illustrated in FIG. 33F, the stage is moved upward such that the irradiation beam IB1 is positioned in an uppermost unit scanning range sa121 in the second column from the left of the die D1. Subsequently, scanning the second column from the left of all of the die D1 and the die D2 is finished to perform die-die comparison of the second column from the left. When scanning and die-die comparison of the right end column are finished in this way, die-die comparison of the all planes of the die D1 and the die D2 is finished.

According to the above scanning process, even when the dies are larger than the deflectable range of the irradiation beam, it is possible to inspect a sample by die-die comparison by comparing an inspection result of the die D1 of the first electron beam irradiation detecting system and an inspection result of the die D2 of the second electron beam irradiation detecting system.

In addition, although, according to the embodiment which has been described with reference to FIGS. 31 to 33, step & repeat scanning of scanning a unit scanning range by deflecting an irradiation beam, then moving the stage, and scanning a new unit scanning range by deflecting the irradiation beam is performed, the stage may be continuously moved.

As described above, the electron beam inspection device 1000 is a sample observing device which observes the sample SM by irradiating the sample SM set on the stage 910 with electron beams, and detecting the electron beams from the sample SM, has the electron column 907 which irradiates the sample SM with the electron beams and detects the second electron beams and the like SE emitted from the sample SM, and this electron column 907 has a plurality of electron beam irradiation detecting systems which each form electron beam paths in which the irradiation beams IB and the secondary electrons and the like SE from the sample SM pass. The electron beam inspection device 1000 inspects the sample SM by simultaneously using a plurality of electron beam irradiation detecting systems and simultaneously irradiating the sample SM with a plurality of electron beams.

Thus, the electron beam inspection device 1000 according to the present embodiment has a plurality of electron beam irradiation detecting systems in one electron column 907, and simultaneously operates the sample by means of a plurality of electron beams by simultaneously using a plurality of electron beam irradiation detecting systems, so that it is possible to reduce the time required to scan the sample without decreasing the resolution. Further, a plurality of electron beam irradiation detecting systems are formed in one electron column, so that it is possible to reduce an interval between adjacent electron beams compared to a case that a plurality of conventional electron columns having one electron beam irradiation detecting system are used to simultaneously irradiate the sample with a plurality of electron beams and, consequently, increase the number of electron beams with which the sample can be simultaneously irradiated.

Although the preferred embodiment of the present invention which can be contrived at this point of time has been described above, the present embodiment can be variously modified, and the attached claims are intended to include all modifications within a scope of a true spirit of the present invention.

INDUSTRIAL APPLICABILITY

As described above, the present invention can reduce the time required to scan electron beams for observing a sample, without decreasing the resolution, and is useful for a sample observing device which observes samples using electron beams.

REFERENCE SIGNS LIST

10 FIRST DEFLECTOR (ALIGNER)
101 ELECTRODE
102 GAP
103 BODY
104 ELECTRODE
105 CUTOUT
106 METAL PLATING
1061a, 1062a, 1063a, 1064a METAL PLATED ELECTRODE PORTION
1061b, 1062b, 1063b, 1064b METAL PLATED WIRING PORTION
1061c, 1062c, 1063c, 1064c VIA 11 CONDENSER LENS
111 CONTACT HOLE
112 BODY
113 METAL PLATING
114 METAL BUSH
115 VIA
116 HOLE
12 SECOND DEFLECTOR (ALIGNER)
13 APERTURE
14 DETECTOR
141 DETECTOR
1411 CERAMIC (SUPPORT BODY)
1412 ANODE
1413 MICROCHANNEL PLATE (MCP)
1414 TUBE
1415 ELECTRICALLY-CONDUCTIVE FILM
1416 MCP INPUT TERMINAL (MCPin)
1417 MCP OUTPUT TERMINAL (MCPout)
1419 SCINTILLATOR
1420 LIGHT GUIDE
1421 PHOTOMULTIPLIER TUBE (PMT)
148 DETECTOR
15 THIRD DEFLECTOR (ALIGNER)
16 OBJECTIVE LENS
17 FOURTH DEFLECTOR (ALIGNER)
170 DEFLECTOR
18 FIFTH DEFLECTOR (ALIGNER)
180 DEFLECTOR
181 UPPER ELECTRODE
182 LOWER ELECTRODE
19 ELECTRODE
20 TO 28 SPACER
201 HOLE
211 HOLE
30 ELECTRON GUN
31 TFE ELECTRON GUN
311 CATHODE CHIP
312 WEHNELT
313 ANODE
314 HEATER POWER SUPPLY
315 CATHODE POWER SUPPLY
316 WEHNELT POWER SUPPLY
32 ELECTRON GUN
321 LASER DIODE
322 FIRST LENS
323 MAGNETIC FIELD COIL
324 GAS FILLED TUBE
325 SECOND LENS
326 ELECTRON EMISSION FIBER
3261 CORE
3262 CLAD
3263 METAL COAT
3264 PHOTOELECTRIC MATERIAL
327 WEHNELT
328 ANODE
33 ELECTRON GUN
331 LASER DIODE
332 FIRST LENS
333 MAGNETIC FIELD COIL
334 GAS FILLED TUBE
335 SECOND LENS 3
336 ELECTRON EMITTING ELEMENT
3361 BASE MATERIAL
3362 APERTURE
3363 METAL COAT
3364 PHOTOELECTRIC MATERIAL
338 ANODE
40 VACUUM PUMP
50 CYLINDRICAL BODY
51 WIRING HOLE
52 CYLINDRICAL BODY HOLE
60 ELECTRON GUN HOUSING
61 BULB
612 BULB HOLE
613, 614 O RING 62 HOUSING HOLE
70 FLEXIBLE PRINTED CABLE (FPC)
71 POLYIMIDE RESIN LAYER
72 ELECTRICALLY-CONDUCTIVE FORMATION LAYER
73 POLYIMIDE RESIN LAYER
74 WIRING HOLE
741 FLANGE PORTION
80, 801, 802, 803, 8041 TO 8044 CONTACT PIN
90 GROUND COATING
900 ELECTRON BEAM INSPECTION DEVICE
901 SAMPLE CARRIER (LOAD PORT)
902 MINI-ENVIRONMENT
903 LOAD LOCK
904 TRANSFER CHAMBER
905 MAIN CHAMBER
906 VIBRATION REMOVAL BOARD
907 ELECTRON COLUMN
908 IMAGE PROCESSING UNIT
909 CONTROL UNIT
910 STAGE
851 UPPER PART
852 LOWER PART
853 SPACER
IB IRRADIATION BEAM
EP ELECTRON BEAM PATH
SE SECONDARY ELECTRONS AND THE LIKE
EL ELECTRICALLY-CONDUCTIVE LINE
ET ELECTRODE
SM SAMPLE
RB REFERENCE BEAM
D DIE
sa UNIT SCANNING RANGE

What is claimed is:

1. A sample observing device which observes a sample by irradiating the sample set on a stage with an electron beam and detecting the electron beam from the sample, comprising:
an electron column which comprises a cylindrical body and a plurality of electron beam irradiation detecting systems, wherein:
each of the plurality of electron beam irradiation detecting systems forms an electron beam path in which the electron beam irradiating the sample and the electron beam from the sample pass,
each of the plurality of electron beam irradiation detecting systems comprises a plurality of parts, the parts comprising a lens, a deflector, and a detector stacked in the cylindrical body, and
the electron column observes the sample by simultaneously using the plurality of electron beam irradiation detecting systems to simultaneously irradiate the sample with a plurality of electron beams and to simultaneously detect the plurality of electron beams from the sample.

2. The sample observing device according to claim 1, wherein:
the electron column further comprises an electron gun housing which covers the cylindrical body, and
the electron gun housing comprises a plurality of electron guns which irradiate each of the electron beam paths with the plurality of electron beams.

3. The sample observing device according to claim 2, wherein:
the electron column further comprises a wiring film which is provided along an outer peripheral surface of the cylindrical body and in which an electrically-conductive line which connects an external power supply to the plurality of parts is laid;
a wiring hole is provided at a position meeting terminals of the plurality of parts in the cylindrical body and the wiring film; and
the terminals of the plurality of parts and the electrically-conductive line of the wiring film are electrically connected by a contact pin inserted in the wiring hole.

4. The sample observing device according to claim 2, wherein the electron gun comprises:
a laser light source which emits laser light;
a gas filled tube which forms plasma small space by the laser light emitted from the laser light source;
a fiber which allows propagation of an invisible light beam emitted from the gas filled tube;
a photoelectric material which is provided at a tip of the fiber, and which receives the invisible light beam having propagated in the fiber and emits an electron; and
an anode which leads an electron emitted from the photoelectric material.

5. The sample observing device according to claim 2, wherein the detector comprises:
a scintillator which captures electrons by bending the electron beam returning from the sample through the electron beam path, and converts the captured electrons into light having an intensity corresponding to an amount of the electrons;
a light guide which transmits the light incident from the scintillator; and
a photomultiplier tube which outputs a signal corresponding to the intensity of the incident light transmitted by the light guide, and measures the amount of the electrons from the sample based on the signal.

6. The sample observing device according to claim 2, wherein:
the electron gun housing comprises a plurality of housing holes meeting the plurality of electron guns;
the sample observing device further comprises a bulb;
the bulb comprises:
a plurality of O rings which surround the plurality of housing holes; and
a plurality of bulb holes which meet the plurality of housing holes, an area surrounded by the plurality of O rings and the plurality of bulb holes being misaligned and provided in the bulb; and
by moving the bulb with respect to the electron gun housing, the housing holes are sealed by the O rings or electron beams from the electron guns are allowed to pass in the bulb holes.

7. The sample observing device according to claim 2, wherein:
the cylindrical body comprises at a lower end portion a plurality of cylindrical body holes meeting the plurality of electron beam irradiation detecting systems;
the sample observing device further comprises a bulb;
the bulb comprises:
a plurality of O rings which each surround the plurality of cylindrical body holes; and
a plurality of cylindrical body holes which meet the plurality of cylindrical body holes, an area surrounded by the plurality of O rings and the plurality of bulb holes being misaligned and provided in the bulb; and
by moving the bulb with respect to the cylindrical body, the cylindrical body holes are sealed by the O rings or electron beams from the electron guns are allowed to pass in the bulb holes.

8. A method of observing a sample using the sample observing device according to any one of claims 1 to 7, comprising:

observing the sample by means of a plurality of electron beams by simultaneously using the plurality of electron beam irradiation detecting systems; and
generating an observation image by synthesizing observation results.

* * * * *